(12) United States Patent  (10) Patent No.: US 8,018,066 B2
Hayashi et al.  (45) Date of Patent: Sep. 13, 2011

(54) SEMICONDUCTOR DEVICE AND METHOD OF MANUFACTURING THE SAME

(75) Inventors: Eiji Hayashi, Tokyo (JP); Kyo Go, Tokyo (JP); Kozo Harada, Tokyo (JP); Shinji Baba, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/753,521

(22) Filed: Apr. 2, 2010

(65) Prior Publication Data

US 2010/0187679 A1 Jul. 29, 2010

Related U.S. Application Data

(62) Division of application No. 12/401,193, filed on Mar. 10, 2009, now Pat. No. 7,791,204, which is a division of application No. 11/406,337, filed on Apr. 19, 2006, now Pat. No. 7,521,799.

(30) Foreign Application Priority Data

Apr. 19, 2005 (JP) ................................. 2005-121063
Mar. 31, 2006 (JP) ................................. 2006-096999

(51) Int. Cl.
H01L 23/48 (2006.01)
H01L 23/52 (2006.01)
H01L 29/40 (2006.01)
(52) U.S. Cl. ........ 257/773; 438/108; 438/118; 174/258; 174/255
(58) Field of Classification Search .................. 257/773; 438/108, 118; 174/255, 258, 260–266; 361/792–795, 760; 428/209, 901
See application file for complete search history.

(56) References Cited

U.S. PATENT DOCUMENTS

| | | | |
|---|---|---|---|
| 6,114,005 | A | 9/2000 | Nagai et al. |
| 6,184,142 | B1 | 2/2001 | Chung et al. |
| 6,274,823 | B1 | 8/2001 | Khandros et al. |
| 6,534,723 | B1 | 3/2003 | Asai et al. |
| 6,538,332 | B2 | 3/2003 | Murayama et al. |
| 6,593,652 | B2 | 7/2003 | Shibata |
| 6,617,683 | B2 | 9/2003 | Lebonheur |
| 6,621,154 | B1 | 9/2003 | Satoh et al. |
| 6,703,564 | B2 | 3/2004 | Mori |

(Continued)

FOREIGN PATENT DOCUMENTS

JP 5-235201 A 9/1993

(Continued)

OTHER PUBLICATIONS

Charles A. Harper, "Electronic Packaging and Interconnection Handbook", 2000, pp. 1.5 and 3.3, Third Edition, McGraw-Hill.

(Continued)

*Primary Examiner* — Zandra Smith
*Assistant Examiner* — Telly D Green
(74) *Attorney, Agent, or Firm* — McDermott Will & Emery LLP

(57) ABSTRACT

Even when a stiffener is omitted, the semiconductor device which can prevent the generation of twist and distortion of a wiring substrate is obtained.

As for a semiconductor device which has a wiring substrate, a semiconductor chip by which the flip chip bond was made to the wiring substrate, and a heat spreader adhered to the back surface of the semiconductor chip, and which omitted the stiffener for reinforcing a wiring substrate and maintaining the surface smoothness of a heat spreader, a wiring substrate has a plurality of insulating substrates in which a through hole whose diameter differs, respectively was formed, and each insulating substrate contains a glass cloth.

17 Claims, 22 Drawing Sheets

U.S. PATENT DOCUMENTS

| | | |
|---|---|---|
| 6,710,446 B2 | 3/2004 | Nagai et al. |
| 6,861,757 B2 | 3/2005 | Shimoto et al. |
| 6,936,919 B2 | 8/2005 | Chuang et al. |
| 7,002,080 B2 | 2/2006 | Tani et al. |
| 7,002,246 B2 | 2/2006 | Ho et al. |
| 7,009,307 B1 | 3/2006 | Li |
| 7,067,902 B2 | 6/2006 | Hichri et al. |
| 7,544,522 B2 | 6/2009 | Kanda et al. |
| 2002/0033275 A1 | 3/2002 | Sumi et al. |
| 2002/0085364 A1 | 7/2002 | Downes |
| 2003/0194537 A1 | 10/2003 | Bhagwagar et al. |
| 2003/0219969 A1 | 11/2003 | Saito et al. |
| 2003/0227095 A1 | 12/2003 | Fujisawa et al. |
| 2003/0234074 A1 | 12/2003 | Bhagwagar |
| 2003/0234277 A1 | 12/2003 | Dias |
| 2004/0058136 A1 | 3/2004 | Nishii et al. |
| 2004/0104042 A1 | 6/2004 | Takase |
| 2004/0160751 A1 | 8/2004 | Inagaki et al. |
| 2004/0188843 A1 | 9/2004 | Wakayama et al. |
| 2004/0232549 A1 | 11/2004 | Saito et al. |
| 2005/0046040 A1 | 3/2005 | Wang et al. |
| 2005/0174738 A1 | 8/2005 | Lam et al. |
| 2005/0224955 A1 | 10/2005 | Desai et al. |
| 2006/0001156 A1 | 1/2006 | Wakiyama et al. |
| 2008/0063879 A1 | 3/2008 | Lin et al. |

FOREIGN PATENT DOCUMENTS

| | | |
|---|---|---|
| JP | 5-251596 A | 9/1993 |
| JP | 8-335604 A | 12/1996 |
| JP | 10-173005 A | 6/1998 |
| JP | 2000-22040 A | 1/2000 |
| JP | 2000-150716 | 5/2000 |
| JP | 2000-260817 A | 9/2000 |
| JP | 2000-349123 A | 12/2000 |
| JP | 2001-110926 | 4/2001 |
| JP | 2001-127095 | 5/2001 |
| JP | 2001-217514 | 8/2001 |
| JP | 2002-261214 A | 9/2002 |
| JP | 2002-311084 A | 10/2002 |
| JP | 2003-51568 A | 2/2003 |
| JP | 2003-273482 A | 9/2003 |
| JP | 2004-083905 | 3/2004 |
| JP | 2004-87856 A | 3/2004 |
| JP | 2004-119691 A | 4/2004 |
| JP | 2004-134679 | 4/2004 |
| JP | 2004-296843 | 10/2004 |
| JP | 2004-327932 A | 11/2004 |
| JP | 2006-19636 A | 1/2006 |

OTHER PUBLICATIONS

Richard C. Jaeger, "Introduction to Microelectronic Fabrication", 2002, p. 1, Second Edition, vol. 5, Prentice Hall.

Kwok K. Ng, "Complete Guide to Semiconductor Devices", 2002, p. 675, Second Edition, IEEE Press/Wiley-Interscience.

Japanese Office Action, with English translation, issued in Japanese Patent Application No. 2006-096999, mailed Nov. 4, 2009.

SEMICONDUCTOR DEVICE AND METHOD OF MANUFACTURING THE SAME

CROSS-REFERENCE TO RELATED APPLICATION

The present application is a Divisional of U.S. patent application Ser. No. 12/401,193, now U.S. Pat. No. 7,791,204 filed Mar. 10, 2009 which is a Divisional of U.S. patent application Ser. No. 11/406,337, filed on Apr. 19, 2006, now U.S. Pat. No. 7,521,799, and claims priority from Japanese patent applications No. 2005-121063 filed on Apr. 19, 2005, and No. 2006-096999 filed on Mar. 31, 2006, the entire contents of each of which are hereby incorporated by reference.

FIELD OF THE INVENTION

The present invention relates to a semiconductor device which makes flip chip connection of a semiconductor chip on a wiring substrate, and forms a heat spreader on a back surface of this semiconductor chip, and its manufacturing method.

DESCRIPTION OF THE BACKGROUND ART

A semiconductor device which makes flip chip connection of the semiconductor chip via the bump on the wiring substrate is proposed. The gap of the semiconductor chip and the wiring substrate is filled up with under-filling resin in this semiconductor device. In order to make heat radiation property high, a heat spreader is formed on the back surface of the semiconductor chip. In order to reinforce a wiring substrate and to maintain the surface smoothness of a heat spreader conventionally, a stiffener (reinforcing plate) was formed (for example, refer to Patent Reference 1).

What formed the build-up substrate by soft resin coating or a soft film being conventionally stuck on both sides of the hard core substrate containing a glass cloth was used as a wiring substrate. And wirings of fine pitch were formed in the build-up substrate. However, since the build-up substrate was soft, the rigidity of the wiring substrate itself was not high.

[Patent Reference 1] Japanese Unexamined Patent Publication No. 2003-51568

SUMMARY OF THE INVENTION

Since a conventional wiring substrate does not have high rigidity as mentioned above, when the stiffener is omitted for cost reduction, and the shape is made to have a clearance between the portion which projects to the perimeter of the chip of the heat spreader, and the wiring substrate upper surface, the wiring substrate of the portion which projects to the perimeter of the chip becomes the shape where, although a very portion is covered by under-filling resin, the most exposes, and twist and distortion of the wiring substrate generate. Hereby, there were problems that the solder ball joined to the under surface of the wiring substrate floated, or a stress was applied to the edge of the semiconductor chip.

There was a problem that the adhesion of a semiconductor chip, a wiring substrate, and under-filling may not be good, and the gap of the semiconductor chip and the wiring substrate was not fully filled up with under-filling resin. And in an argon spatter, argon etc. could not fully be supplied to the narrow gap of the semiconductor chip and the wiring substrate, and the adhesion of the gap concerned has not fully been improved.

When the stiffener is omitted for cost reduction, the shape is made to have a clearance between the portion which projects to the perimeter of the chip of the heat spreader, and the wiring substrate upper surface, and heat radiation resin is thin, a crack and a damage will enter into the semiconductor chip easily. On the other hand, when heat radiation resin is thick, the divergence characteristics of heat will worsen. Therefore, it is necessary to control the thickness of heat radiation resin with high precision.

In the case that the stiffener is omitted, and the shape is made to have a clearance between the portion which projects to the perimeter of the chip of the heat spreader, and the wiring substrate upper surface, when a solder ball is formed on the under surface of the wiring substrate, and doing an electric test of the wiring substrate and the semiconductor chip after that, there was also a problem of the heat spreader having hit a formation instrument and a test instrument, and damaging.

The present invention was made in order to solve the above problems. The first purpose is to obtain a semiconductor device which can prevent the generation of twist and distortion of a wiring substrate, even when the stiffener is omitted.

The second purpose is to obtain a manufacturing method of a semiconductor device which can improve the filling factor of the under-filling resin in the gap of a semiconductor chip and a wiring substrate.

The third purpose is to obtain a semiconductor device which can control the thickness of heat radiation resin with high precision, when the shape is made to omit the stiffener and to have a clearance between the portion which projects to the perimeter of the chip of the heat spreader, and the wiring substrate upper surface.

The fourth purpose is to obtain a manufacturing method of a semiconductor device which can prevent a heat spreader's hitting a formation instrument and a test instrument, and damaging in the case of formation of a solder ball, or an electric test, even when the shape is made to omit the stiffener and to have a clearance between the portion which projects to the perimeter of the chip of the heat spreader, and the wiring substrate upper surface.

The semiconductor device concerning claim 1 of the present invention comprises: a wiring substrate; a semiconductor chip which is flip-chip-bonded over the wiring substrate; and a heat spreader adhered over a back surface of the semiconductor chip; wherein a stiffener for reinforcing the wiring substrate and maintaining a surface smoothness of the heat spreader is omitted; and the wiring substrate has a plurality of insulating substrates in which a through hole whose diameter differs, respectively is formed, and each insulating substrate contains a glass cloth.

The semiconductor device concerning claim 2 of the present invention comprises: a wiring substrate; a semiconductor chip which is flip-chip-bonded over the wiring substrate; and a heat spreader adhered over a back surface of the semiconductor chip; wherein a stiffener for reinforcing the wiring substrate and maintaining a surface smoothness of the heat spreader is omitted; and the wiring substrate has a plurality of layers of insulating substrates in which a through hole whose diameter is less than 100 μm is formed, and a plurality of layers of wiring layers, and the insulating substrate contains a glass cloth.

The method of manufacturing a semiconductor device concerning claim 3 of the present invention comprises the steps of: flip-chip-bonding a semiconductor chip via a bump over a wiring substrate; supplying $O_2$ plasma in a gap of the wiring substrate and the semiconductor chip after the step of flip-chip-bonding; and pouring under-filling resin in the gap of the wiring substrate and the semiconductor chip after the step of supplying $O_2$ plasma.

The semiconductor device concerning claim 4 of the present invention comprises: a wiring substrate; a semiconductor chip flip-chip-bonded over the wiring substrate; and a heat spreader adhered over a back surface of the semiconductor chip with heat radiation resin; wherein the heat radiation resin contains a filler; and by setting a thickness of the heat radiation resin to A, and a maximum grain size of the filler to $B_{MAX}$, a relation: $A \times 4/5 \geq B_{MAX}$ is held.

The semiconductor device concerning claim 5 of the present invention comprises: a wiring substrate; a semiconductor chip flip-chip-bonded over the wiring substrate; and a heat spreader adhered over a back surface of the semiconductor chip with heat radiation resin; wherein the heat radiation resin contains a filler and a spacer; and by setting a thickness of the heat radiation resin to A, and an average particle diameter of the spacer to C, a relation of $A \times 9/10 \geq C$ is held.

The method of manufacturing a semiconductor device concerning claim 11 of the present invention comprises the steps of: flip-chip-bonding a semiconductor chip over an upper surface of a wiring substrate; adhering a heat spreader smaller than the wiring substrate over a back surface of the semiconductor chip; holding the wiring substrate by a hold means which touches a portion which is an upper surface of the wiring substrate and an outside of the heat spreader, turning the upper surface of the wiring substrate down; and joining a solder bump to an under surface of the wiring substrate where the wiring substrate is held. The other features of the present invention are made clear to below.

By the semiconductor device concerning claim 1 or 2 of the present invention, even when the shape is made to have a clearance between the portion which projects to the perimeter of the chip of the heat spreader, and the wiring substrate upper surface, the generation of twist and distortion of the wiring substrate can be prevented.

By the method of manufacturing a semiconductor device concerning claim 3 of the present invention, the filling factor of the under-filling resin in the gap of a semiconductor chip and a wiring substrate can be improved.

By the semiconductor device concerning claim 4 or 5 of the present invention, even when the shape is made to have a clearance between the portion which projects to the perimeter of the chip of the heat spreader, and the wiring substrate upper surface, the thickness of heat radiation resin can be controlled with high precision.

By the method of manufacturing a semiconductor device concerning claim 11 of the present invention, even when the shape is made to have a clearance between the portion which projects to the perimeter of the chip of the heat spreader, and the wiring substrate upper surface, a heat spreader's hitting a formation instrument and a test instrument, and damaging can be prevented in the case of formation of a solder ball.

BRIEF DESCRIPTION OF THE DRAWINGS

FIG. 22 is a sectional view showing the semiconductor device concerning Embodiment 2 of the present invention; and.

DETAILED DESCRIPTION OF THE PREFERRED EMBODIMENTS

Embodiment 1

Hereafter, the manufacturing method of the semiconductor device concerning Embodiment 1 of the present invention is explained using drawings.

Figure 1:
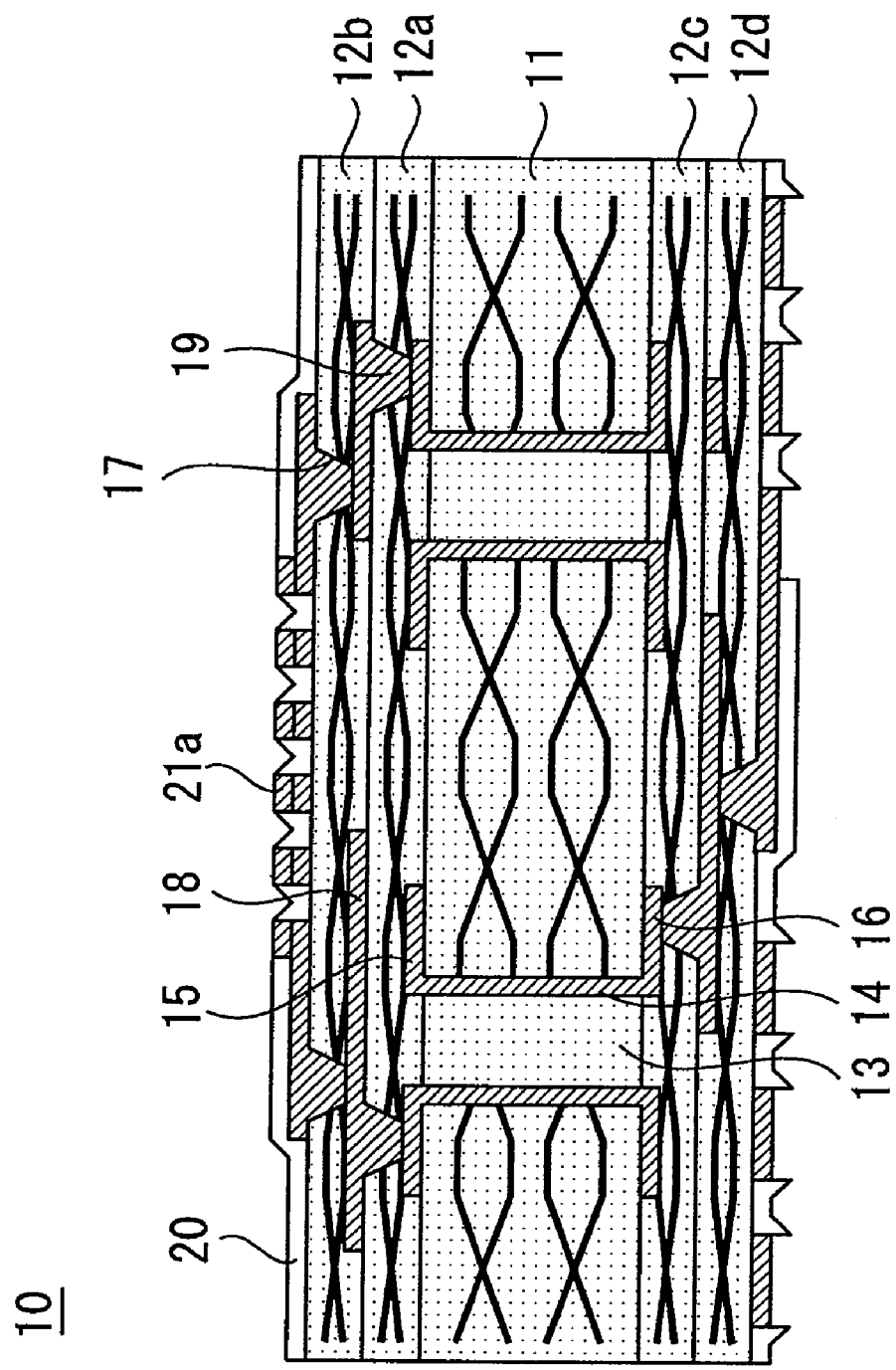
FIG. 1 is a sectional view showing the wiring substrate of the semiconductor device concerning Embodiment 1 of the present invention.
Figure 2:
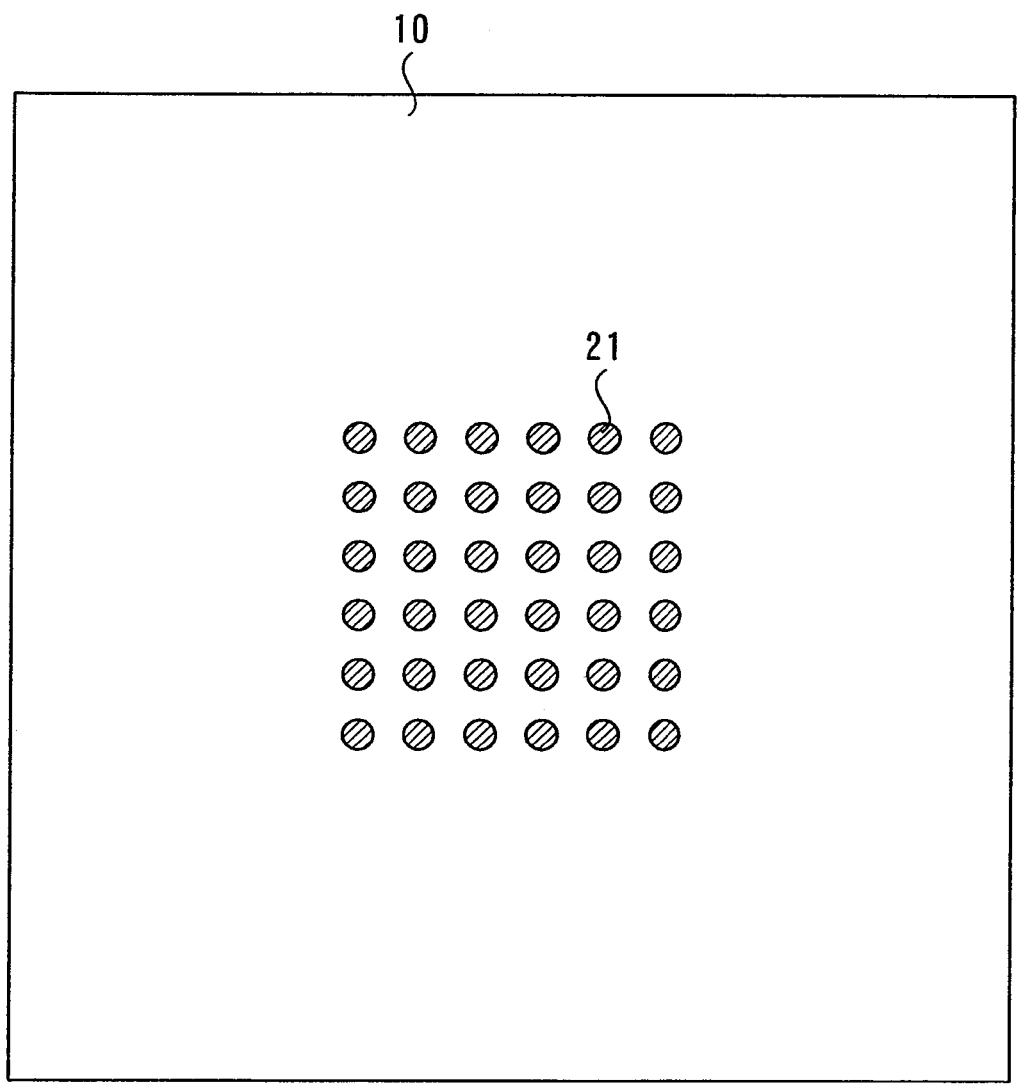
FIG. 2 is a top view showing the wiring substrate of the semiconductor device concerning Embodiment 1 of the present invention.
Figure 3:
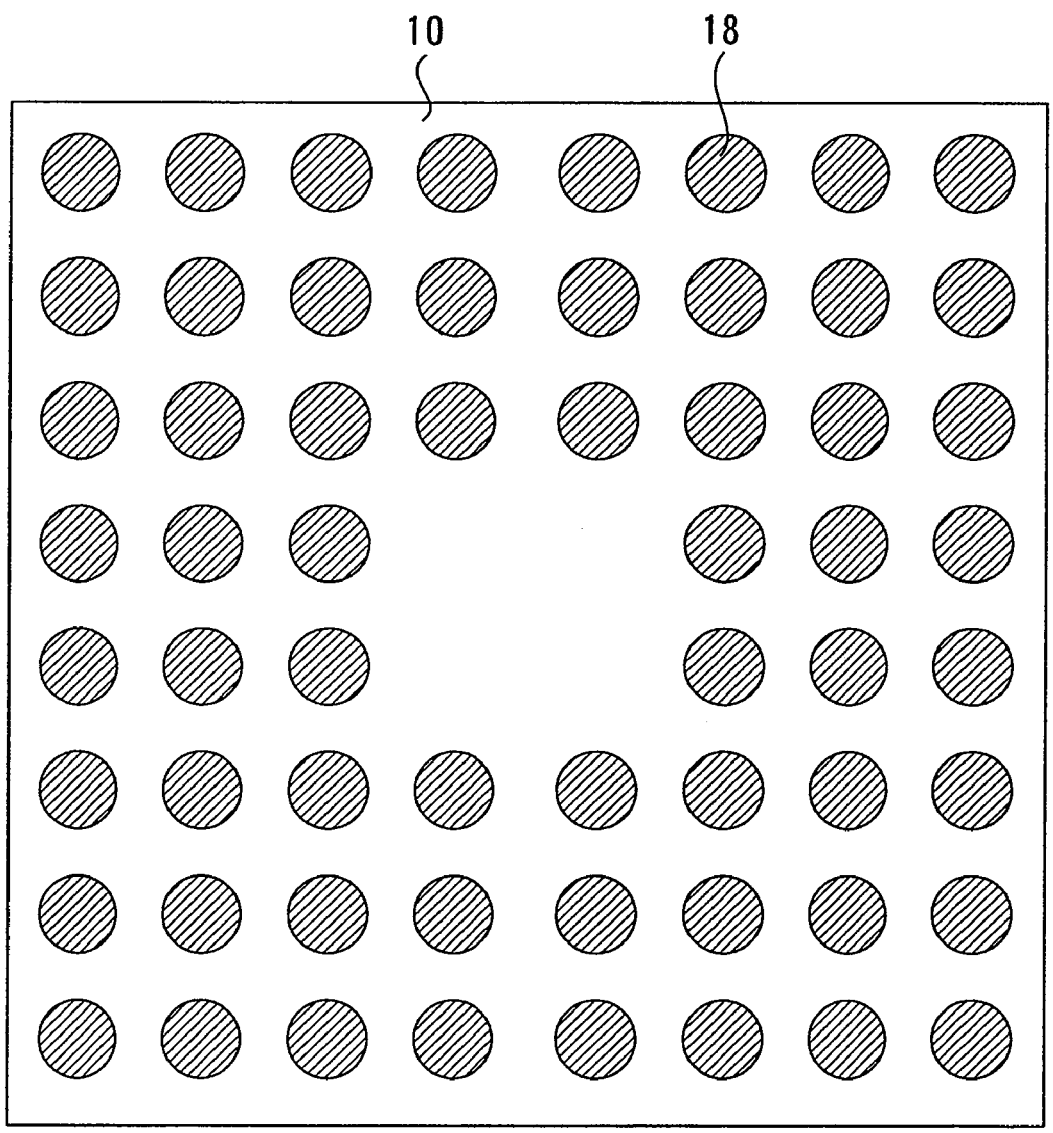
FIG. 3 is a bottom view showing the wiring substrate of the semiconductor device concerning Embodiment 1 of the present invention.

FIG. 1 is a sectional view showing the wiring substrate of the semiconductor device concerning Embodiment 1 of the present invention, FIG. 2 is the top view, and FIG. 3 is the bottom view.

This wiring substrate 10 puts build-up substrates 12a and 12b on the upper surface of core substrate 11, puts build-up substrates 12c and 12d on the under surface, and is made to unify by thermo-compression using a vacuum press etc. However, in order to prevent a warp of wiring substrate 10, the build-up substrate of the same number of sheets is bonded together to the upper and lower sides of core substrate 11.

And core substrate 11 and build-up substrates 12a-12d include a layer in which the glass cloth was impregnated with insulating resin to solidify into a plate, respectively. Here, the textile fabrics which include long glass textiles, or the non-woven fabric which includes short glass textiles is also good as a glass cloth. And the cross which includes another insulating materials with high rigidity compared with insulating resin, for example, a carbon fiber etc., instead of a glass cloth can also be used.

As insulating resin, for example polysulfone, polyether sulfone, polyphenyl sulfone, polyphthalamide, polyamidoimide, polyketone, polyacetal, polyimide, polycarbonate, modified polyphenylene ether, polybutylene terephthalate, polyarylate, polysulfone, polyphenylene sulfide, polyetheretherketone, tetrafluoroethylene, epoxy, bismaleimide system resin, etc. can be used.

Through hole 13 is formed in core substrate 11 by the drill. The diameter of through hole 13 is 100-300 μm, and is 200 μm here. And through hole via 14 which includes Cu etc. is formed at the side wall of through hole 13 by plating etc. Wiring layer 15 which includes Cu etc. is formed on the upper surface of core substrate 11 by an electroplating method, photo lithography, etc. And wiring layer 16 which includes Cu etc. is similarly formed on the under surface of core substrate 11. This wiring layer 15 and wiring layer 16 are connected via through hole via 14.

Through hole 17 is formed also in build-up substrates 12a-12d, respectively. However, since build-up substrates 12a-12d are thin compared with core substrate 11, and fine processing is easy for them, a diameter of through hole 17 of build-up substrates 12a-12d is small compared with that of through hole 13 of core substrate 11, is 30-100 μm concretely, and is 50 μm here. UV-YAG laser, carbon dioxide gas laser, excimer laser, a dry etching method using plasma, etc. can be used for formation of this through hole 17.

On build-up substrate 12a-12d, wiring layer 18 which includes Cu etc., is respectively formed by an electroplating method, photo lithography, etc. And through hole via 19 is formed in through hole 17 by filling up with electric conduction paste, such as Cu.

The front surface of wiring substrate 10 is covered by solder resist 20. Opening is formed in this solder resist 20, and a part of top and lowest wiring layer 18 is exposed. As solder resist 20, a resin which is electrically and thermally excellent, such as an epoxy system, a polyimide system, an acrylic system, and BT system, can be used.

And bump 21a which includes lead free solder is formed by plating or vacuum deposition on the exposed top wiring layer 18. These bumps 21a are arranged on wiring substrate 10 in a lattice manner. In FIG. 2, although bumps 21a are arranged at full matrix form in the region on which semiconductor chip 22 is arranged, various arrangement can be chosen suitably. Lead free solder is solder in which lead is not included or only lead of the grade (less than 1 wt %) with few environmental impacts is included. Here, what contained Cu 1 to 3% in Sn is used as lead free solder.

Figure 4:
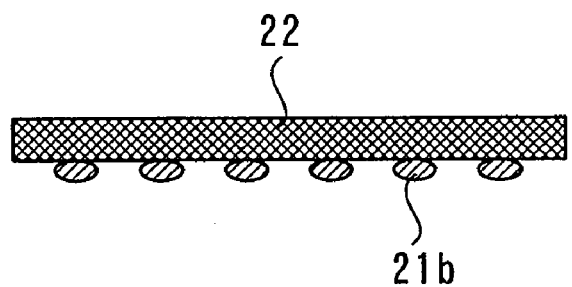
FIG. 4 is a side view of a semiconductor chip.
Figure 5:
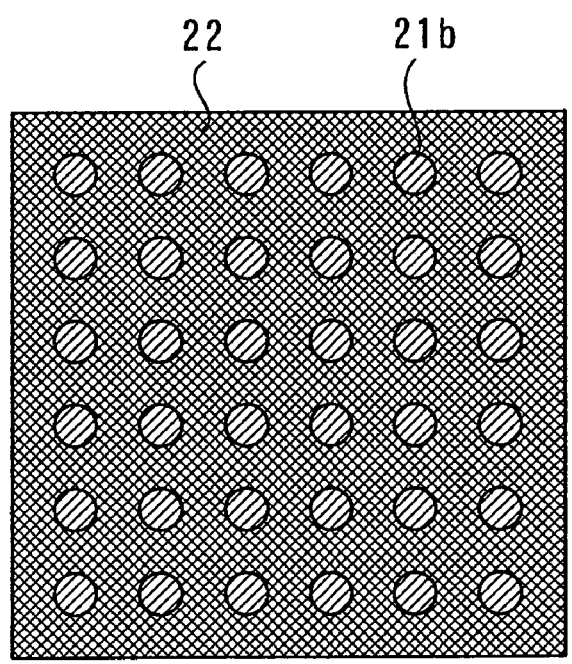
FIG. 5 is a bottom view of a semiconductor chip.
Figure 23:
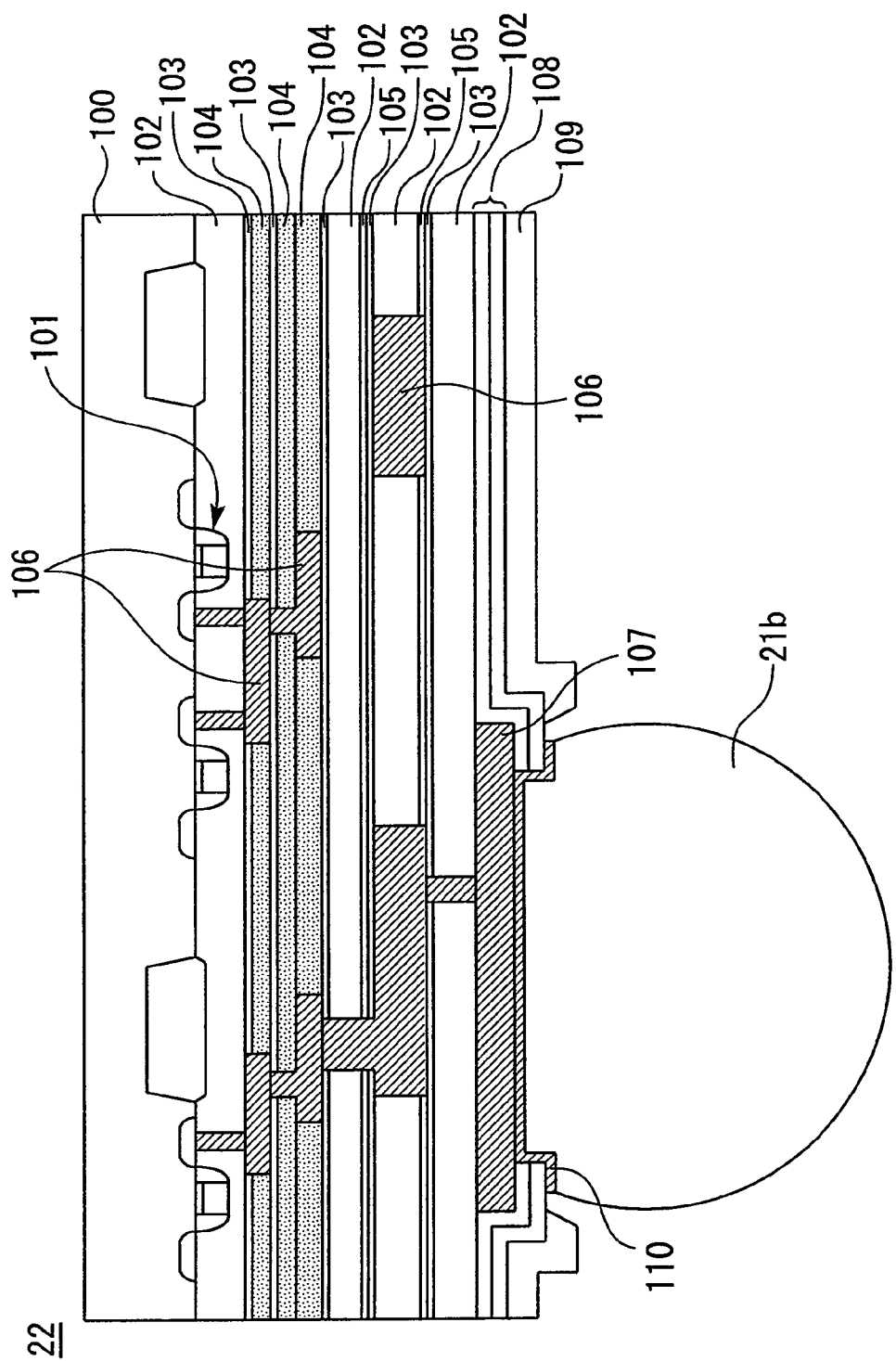
FIG. 23 is a partially expanded cross-sectional view of a semiconductor chip.

FIG. 4 is a side view of a semiconductor chip, and FIG. 5 is the bottom view. Bumps 21b which include lead free solder are formed on the mounting surface of semiconductor chip 22 by plating or vacuum deposition. The partially expanded cross-sectional view of semiconductor chip 22 is described in FIG. 23. Semiconductor chip 22 is provided with silicon substrate 100, semiconductor element 101 formed on silicon substrate 100, such as MOSFET, an interlayer insulation film which includes a laminated structure of $SiO_2$ insulating film 102, SiCN etching stopper film 103, SiOC low dielectric constant film 104, and SiOF tightly adhering film 105, wiring layer 106 in a chip which includes a tungsten plug embedded in this interlayer insulation film, Cu wiring, etc., aluminum pad layer 107 formed on the interlayer insulation film, a laminated film of inorganic passivation film 108 which includes a $SiO_2$/SiN laminated film, and organic passivation film 109 which includes a polyimide film (PiQ film) in which an opening was formed so that aluminum pad 107 might be exposed, barrier metal 110 which was formed on aluminum pad 107 and which includes, for example a Ti/Cu/Ni laminated film, and solder bump 21b formed on barrier metal 110. When using a film of a dielectric constant lower than the dielectric-constant of $SiO_2$ film K=4.3 as an interlayer insulation film in semiconductor chip 22, the strength reduction of the interlayer insulation film poses a problem. The problem is remarkable in a porous Low-k film which reduces a dielectric constant by reducing the density of a film especially as compared with the TEOS film which is $SiO_2$ common film. The technology of reducing the stress applied to a chip becomes very important, when improving the reliability of a semiconductor device. In this embodiment, a porous SiOC film is adopted as a low dielectric constant film. This porous SiOC film is methyl-containing polysiloxane which mainly includes many Si—$CH_3$ groups, since a gap is generated in molecular structure by existence of $CH_3$, it becomes porosity, and the dielectric constant is falling. As a material which forms semiconductor chip 22, although the example was shown above, it is not restricted to these. For example, as a low dielectric constant film, a porous low dielectric constant film of SiOCH base, porous silica system materials, such as a Nano Clustering Silica film, H-containing polysiloxane which is called porous HSQ, organic polymer film, and a porous film of organic polymer etc. are available suitably.

Next, the step which performs flip chip bond of the semiconductor chip 22 on the above-mentioned wiring substrate 10 is explained.

Figure 6:
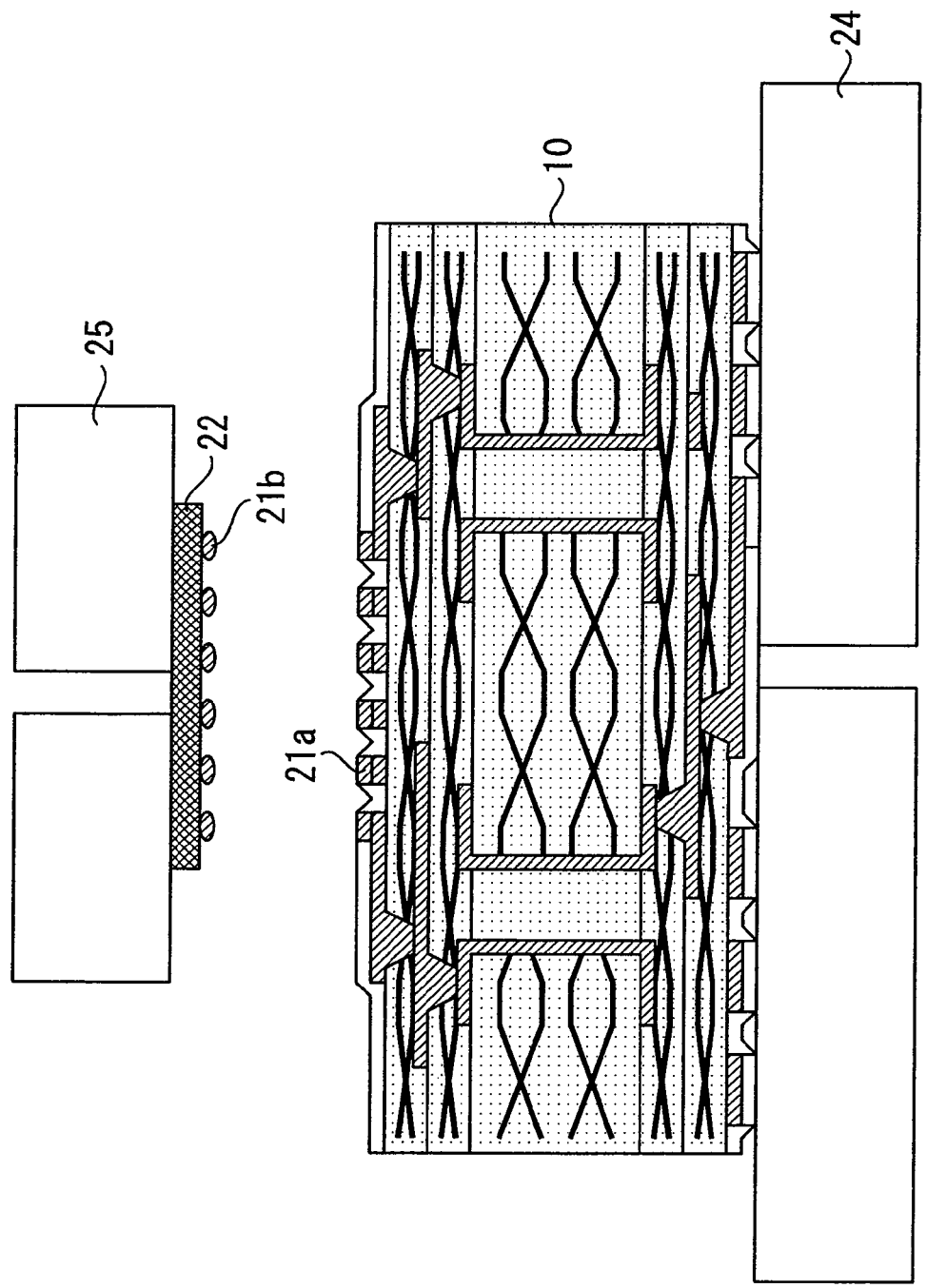
FIG. 6 is a sectional view showing the state where the semiconductor chip was located above wiring substrate 10.

First, as shown in FIG. 6, wiring substrate 10 is laid in the predetermined location on bonding stage 24. And the surface on which bumps 21b were formed is turned down, and vacuum adsorption of the semiconductor chip 22 is made on the under surface of bonding head 25. And horizontal displacement of the bonding head 25 is made, and semiconductor chip 22 is located above wiring substrate 10.

On this occasion, bonding stage 24 heats wiring substrate 10 to about 150° C. with the built-in heater (un-illustrating). Similarly, bonding head 25 heats semiconductor chip 22 to about 150° C. with the built-in heater (un-illustrating).

Figure 7:
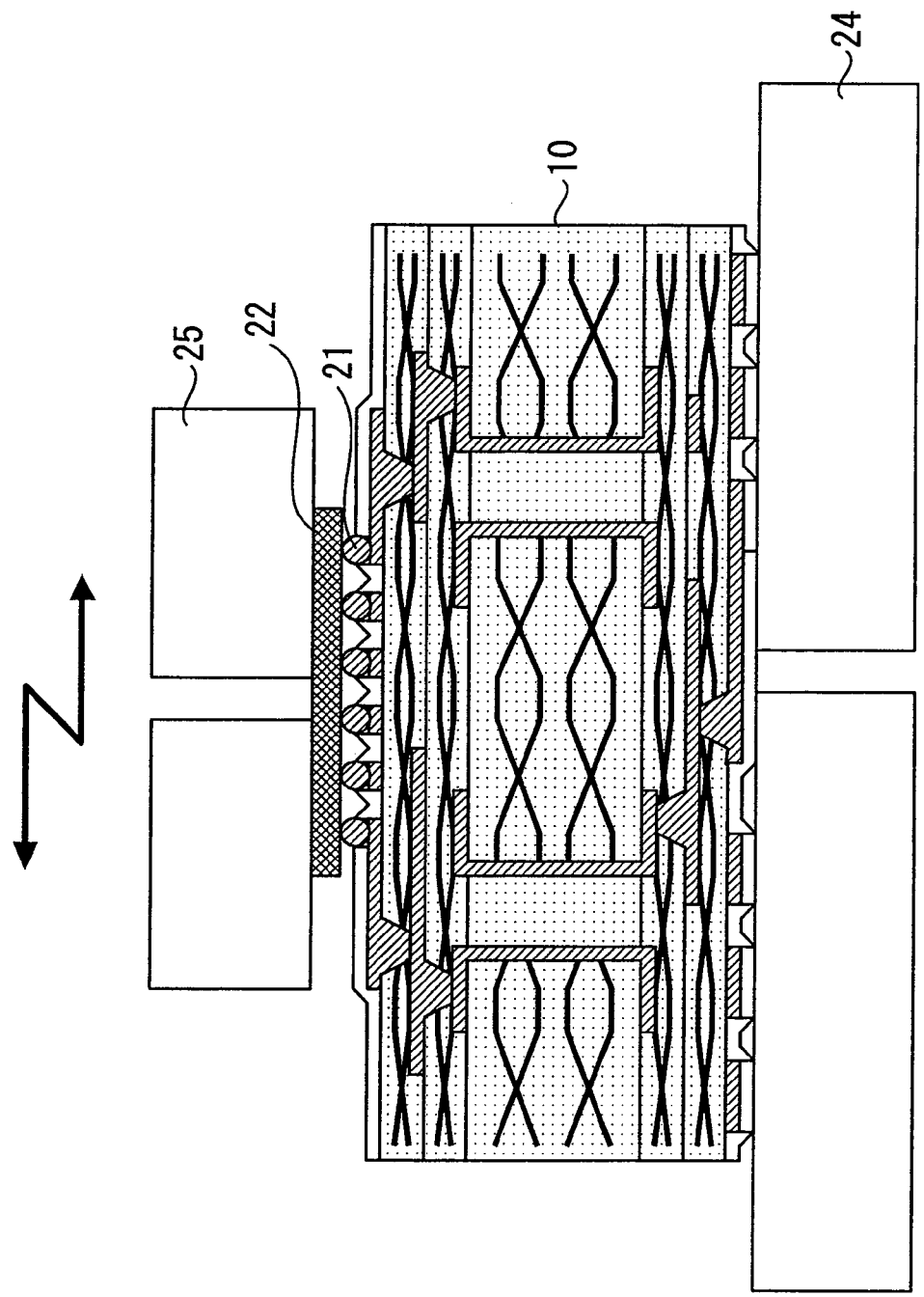
FIG. 7 is a sectional view showing the state that the bump of a semiconductor chip and the bump of a wiring substrate are made to weld by pressure.

Next, bonding head 25 is descended and bump 21b of semiconductor chip 22 and bump 21a of wiring substrate 10 are made to weld by pressure, as shown in FIG. 7. In this condition, semiconductor chip 22 is heated to about 260° C. which is more than a solder melting point by bonding head 25, and bonding head 25 is made to move (scrub) rhythmically periodically to a horizontal direction or a perpendicular direction, where bumps 21a and 21b are melted. As a result, bump 21a and bump 21b unify, and bump 21 is formed.

Figure 8:
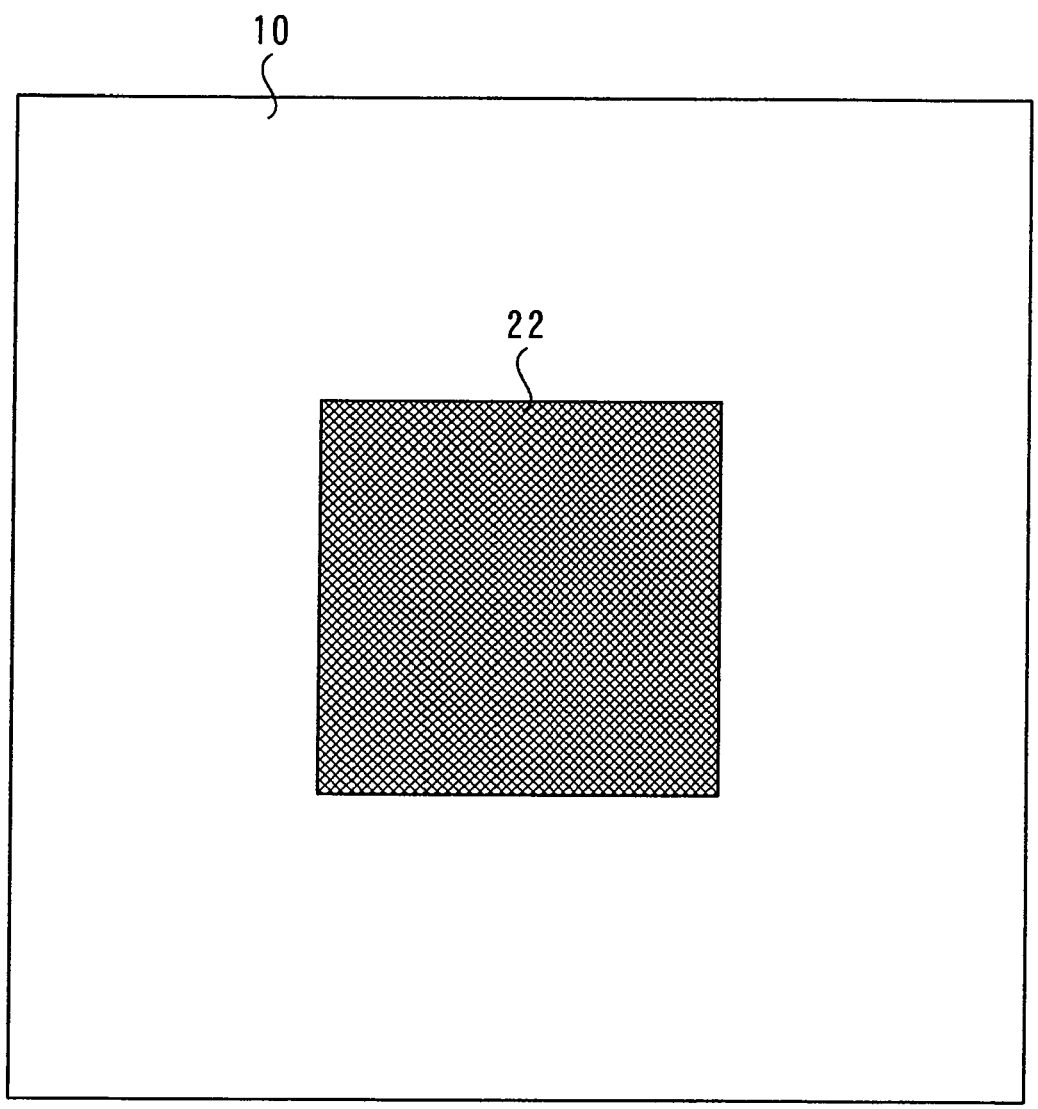
FIG. 8 is a top view showing the state where the flip chip bond of the semiconductor chip was made to the upper surface of the wiring substrate.

Then, bonding head 25 is cooled to temperature lower than a solder melting point, and bump 21 is solidified. And adsorption of semiconductor chip 22 by bonding head 25 is canceled, bonding head 25 is raised, and bonding is terminated. FIG. 8 is a top view showing the condition of having made the flip chip bond of the semiconductor chip to the upper surface of the wiring substrate.

Since the flip chip bond can be performed for semiconductor chip 22 to wiring substrate 10 via bump 21 according to the above-mentioned step, without using flux, the washing process of the flux can be skipped. Since void is not formed in bump 21 by expansion of a flux residue, reliability can be improved.

Next, the step which forms under-filling resin between semiconductor chip 22 and wiring substrate 10 in order to prevent that bump 21 is injured with thermal stress etc. is explained.

Figure 9:
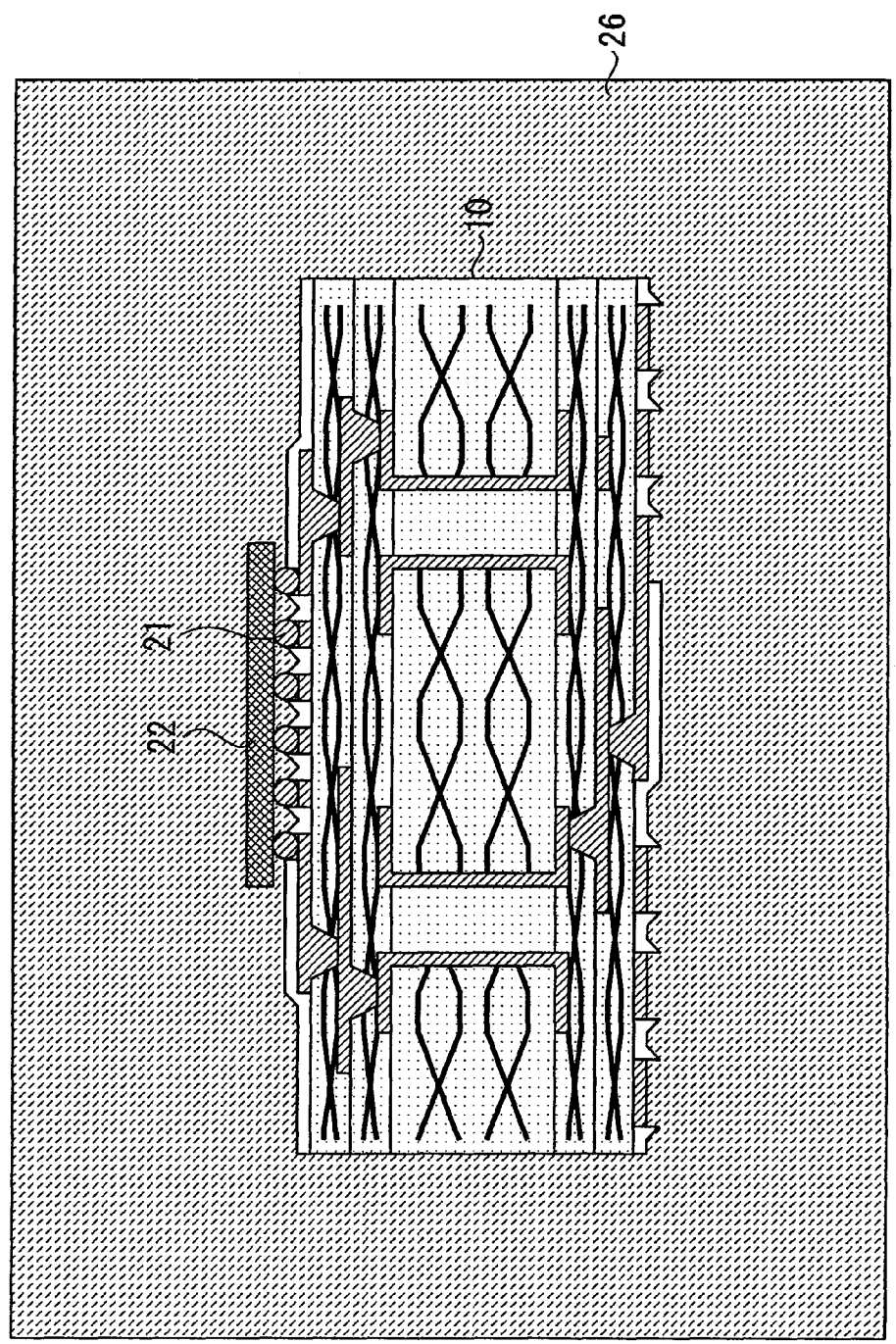
FIG. 9 is a sectional view showing the state that a wiring substrate and a semiconductor chip are exposed to $O_2$ plasma.

First, as shown in FIG. 9, wiring substrate 10 and semiconductor chip 22 are exposed to $O_2$ plasma. Since this $O_2$ plasma also enters a slit compared with an argon spatter etc., $O_2$ plasma can be supplied also to the gap of semiconductor chip 22 and wiring substrate 10.

The passivation films (for example, organic resin films, such as a polyimide film) of wiring substrate 10 and semiconductor chip 22 are cleaned and activated (roughened) by this plasma treatment. Hereby, adhesion with the under-filling resin formed later can be improved. The filling factor of under-filling resin in the gap of semiconductor chip 22 and wiring substrate 10 can be improved.

Figure 10:
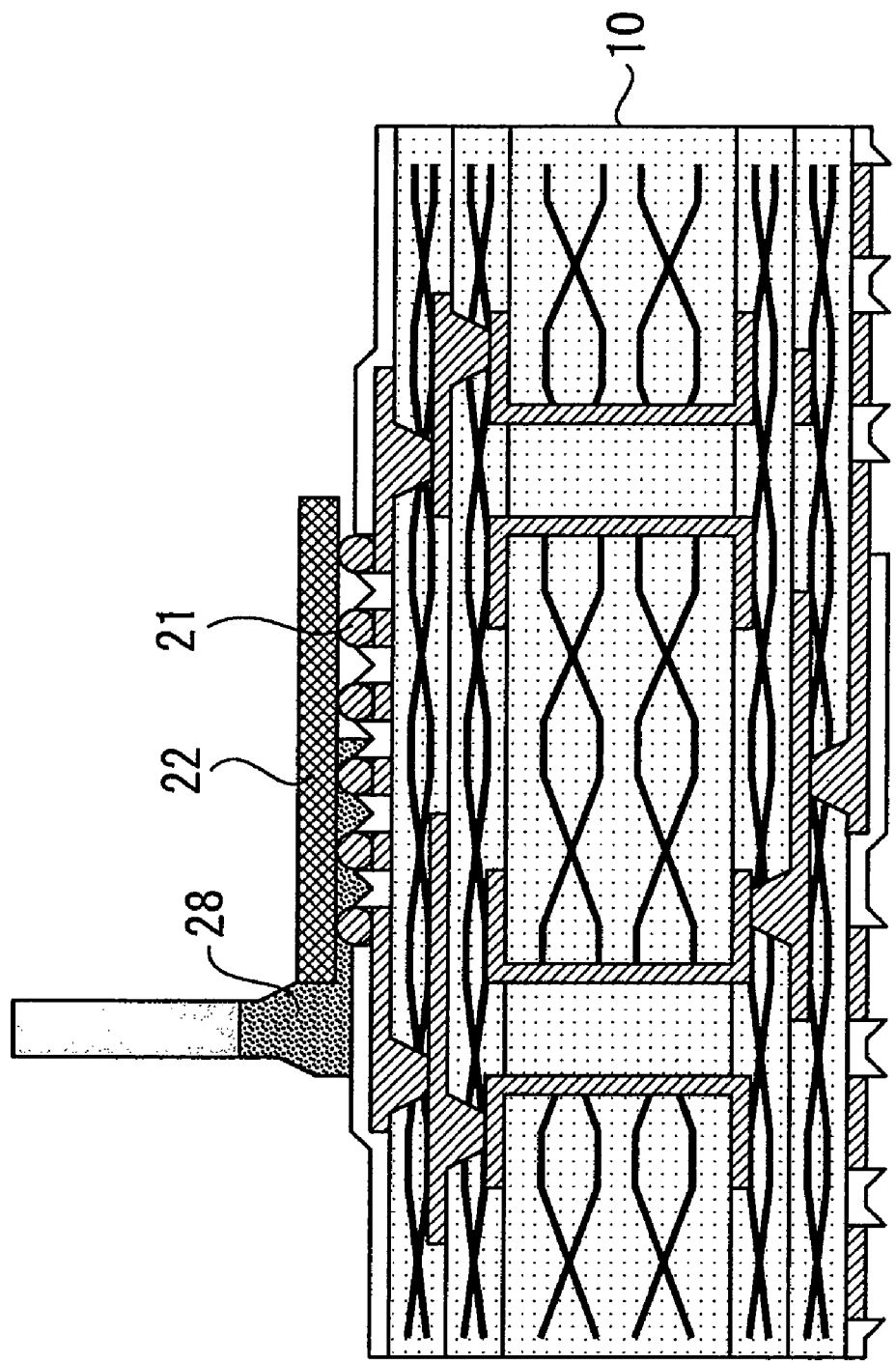
FIG. 10 is a sectional view showing the state that under-filling resin is poured into the gap of a semiconductor chip and a wiring substrate.

Next, as shown in FIG. 10, under-filling resin 28 of paste state or liquid state is poured into the gap of semiconductor chip 22 and wiring substrate 10. Thermosetting resin, such as an epoxy resin, can be used as under-filling resin 28, and a filler etc. may be contained.

Here, the under-filling resin whose glass transition temperature (Tg) is 100-120° C., for example, 110° C., is used. However, although there are various measuring methods of Tg, the DMA method (pull method) is used here.

Figure 11:
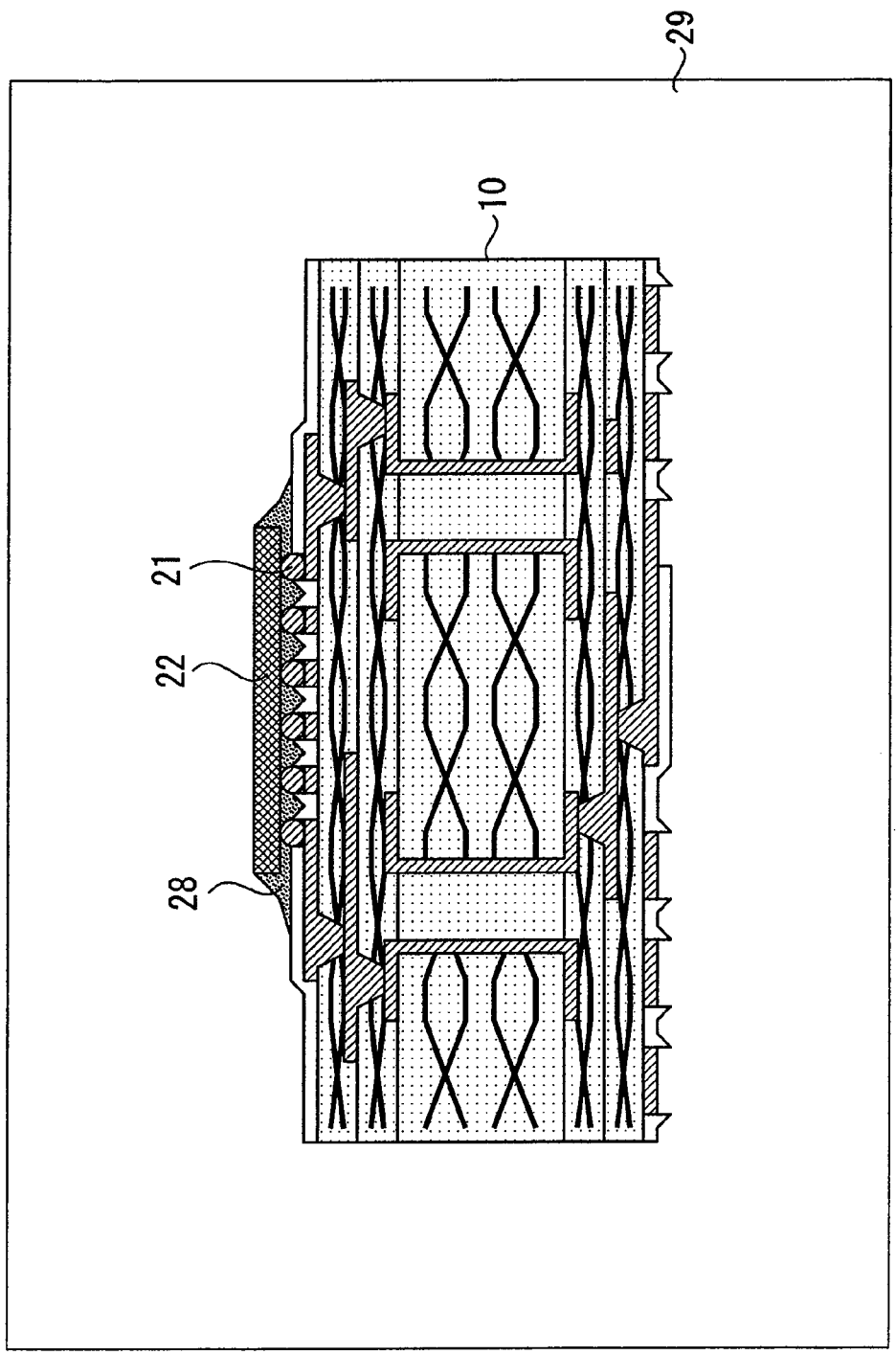
FIG. 11 is a sectional view showing the state that a wiring substrate and a semiconductor chip are put in a baking furnace, and baking is performed.

Next, as shown in FIG. 11, wiring substrate 10 and semiconductor chip 22 are put in baking furnace 29, and baking of about 6 hours is performed at about 125° C. which is low temperature from the former. This cures under-filling resin 28.

Thus, the modulus of elasticity of under-filling resin is securable by making Tg to more than or equal to 100° C. also at about 125° C.-150° C. which are generally asked for operational reliability. For this reason, a bump can fully be protected.

Resin curing temperature (curing temperature) can be made low by making Tg less than or equal to 120° C. For this reason, after curing under-filling resin, the difference of temperature at the time of making it change from resin curing temperature to low temperature can be made small, and the internal stress applied to a chip can be made small.

Next, the step which adheres a heat spreader on the back surface (the surface of the opposite side to the mounting surface) of semiconductor chip 22 is explained.

Figure 12:
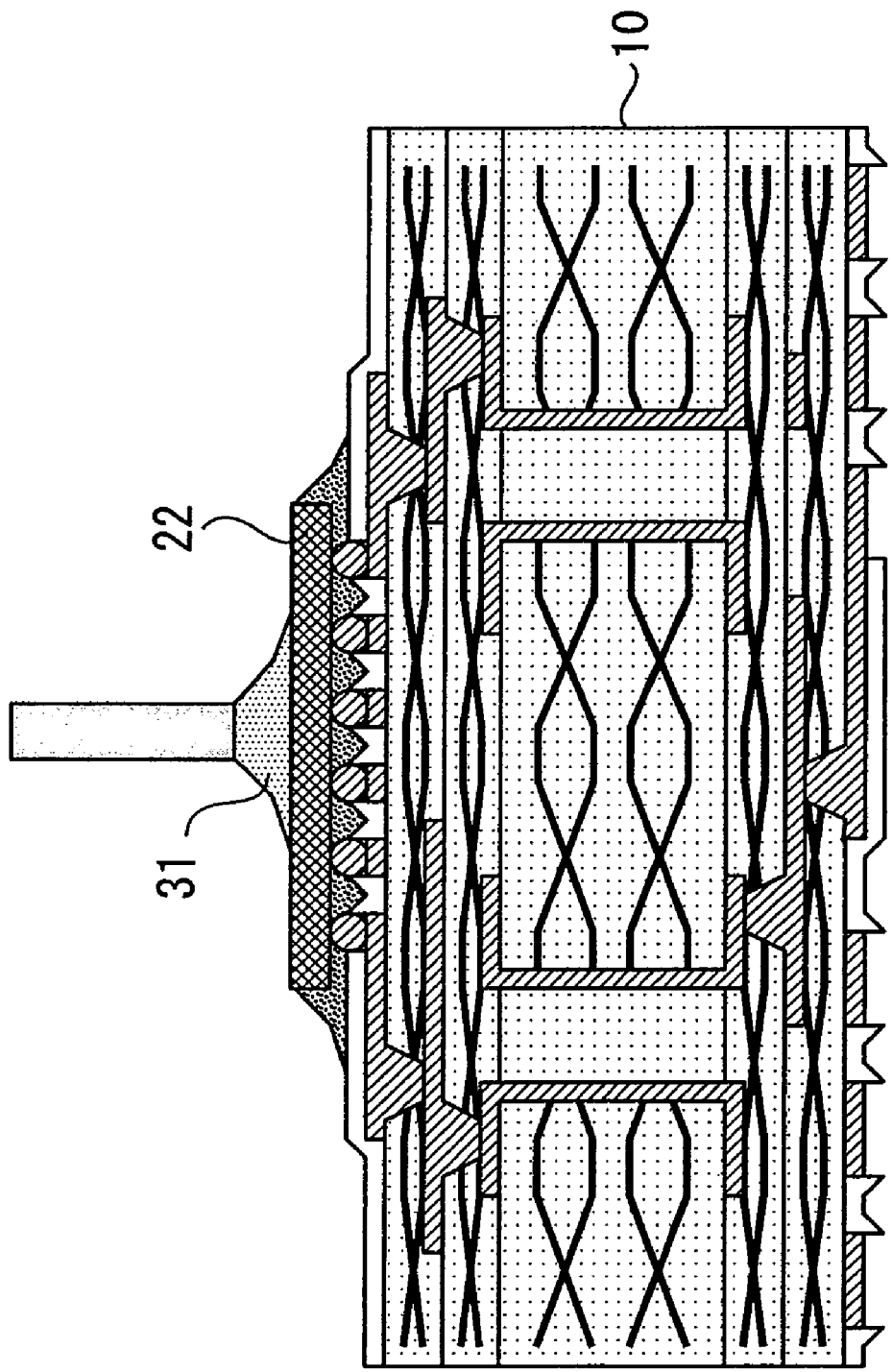
FIG. 12 is a sectional view showing the state that heat radiation resin is applied to the back surface of a semiconductor chip.
Figure 13:
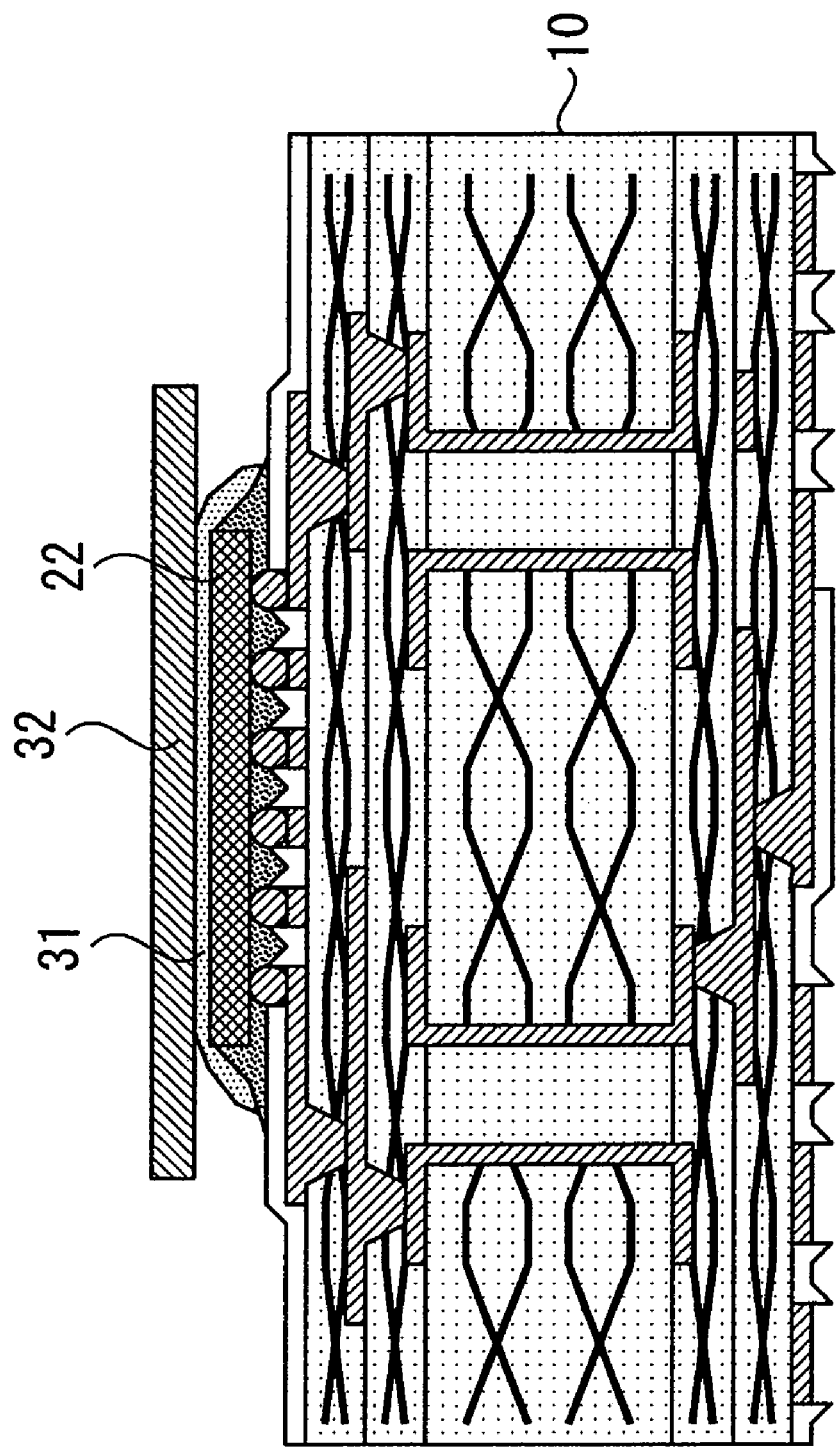
FIG. 13 is a sectional view showing the state that a heat spreader is adhered on the back surface of a semiconductor chip.

First, as shown in FIG. 12, heat radiation resin 31 is applied to the back surface of semiconductor chip 22. Next, as shown in FIG. 13, heat spreader 32 is adhered on the back surface of semiconductor chip 22 with heat radiation resin 31. As material of heat spreader 32, Cu, Al, Al—Si—Cu alloy, etc. can be used in consideration of heat radiation property.

Since the stiffener is omitted for cost reduction, and the shape is made to have a clearance more than or equivalent to the thickness of the chip between the portion which projects to the perimeter of the chip of the heat spreader, and the wiring substrate upper surface, when heat radiation resin 31 is thin, a crack and a damage will enter into semiconductor chip 22 easily. On the other hand, when heat radiation resin 31 is thick, the divergence characteristics of heat will worsen. Therefore, it is necessary to control the thickness (gap) of heat radiation resin 31 with high precision.

Then, the size of the filler mixed in heat radiation resin 31 is optimized, and the thickness of heat radiation resin 31 is controlled. Here, the thing the average particle diameter of whose filler is 13 μm is used. However, since the size of a filler has a distribution, the thing whose particle diameter is more than or equal to 45 μm is cut using a mesh. Hereby, the thickness of heat radiation resin is controllable to 60±20 μm.

Namely, by setting the desired thickness of heat radiation resin to A, and the maximum grain size of a filler to $B_{MAX}$, a filler is chosen so that it may have the relation:

$$A \times 4/5 \geq B_{MAX}.$$

Hereby, the thickness of heat radiation resin is controllable within fixed limits centered on desired thickness. As heat radiation resin 31, it is preferred to use the heat-curing type heat radiation resin of a silicone system from the ease of workability and the height of the heat conductivity. Silicone system heat radiation resin is the resin which blended highly thermally conductive powders, such as alumina, with the base of silicone oil. Since it is a product of high viscosity grease state in the state before cure, the thickness of heat radiation resin 31 can be controlled comparatively easily and in quite high accuracy by using the position control of a jig. As viscosity of heat radiation resin 31, material higher than the viscosity at the time of injection of under-filling resin 28 is preferred at least. As maximum grain size $B_{MAX}$ of a filler, although not restricted to 4/5 or less of thickness A of heat radiation resin, it is preferred to have the relation that maximum grain size $B_{MAX}$ of a filler is smaller than the portion $A_{MIN}$ at which the thickness becomes the smallest of heat radiation resin. When $B_{MAX}$ becomes the same as $A_{MIN}$, or larger than that, possibility that a filler will be put between heat spreader 32 and semiconductor chip 22 back surface will become high. Especially when it does not have the structure which supports heat spreaders 32, such as a stiffener, firmly around semiconductor chip 22 like this embodiment, in the step which sticks a heat spreader, when it is going to control the thickness of heat radiation resin only by load control, by the filler inserted between heat spreader 32 and semiconductor chip 22, a crack may enter into semiconductor chip 22 back surface, and the reliability of the semiconductor device may be dropped.

Shape of a filler is made into a globular form and the damage to semiconductor chip 22 or heat spreader 32 is made small. Here, when the shape of a filler is not a globular form strictly, let the particle diameter of a filler be a diameter of the longest place.

Figure 14:
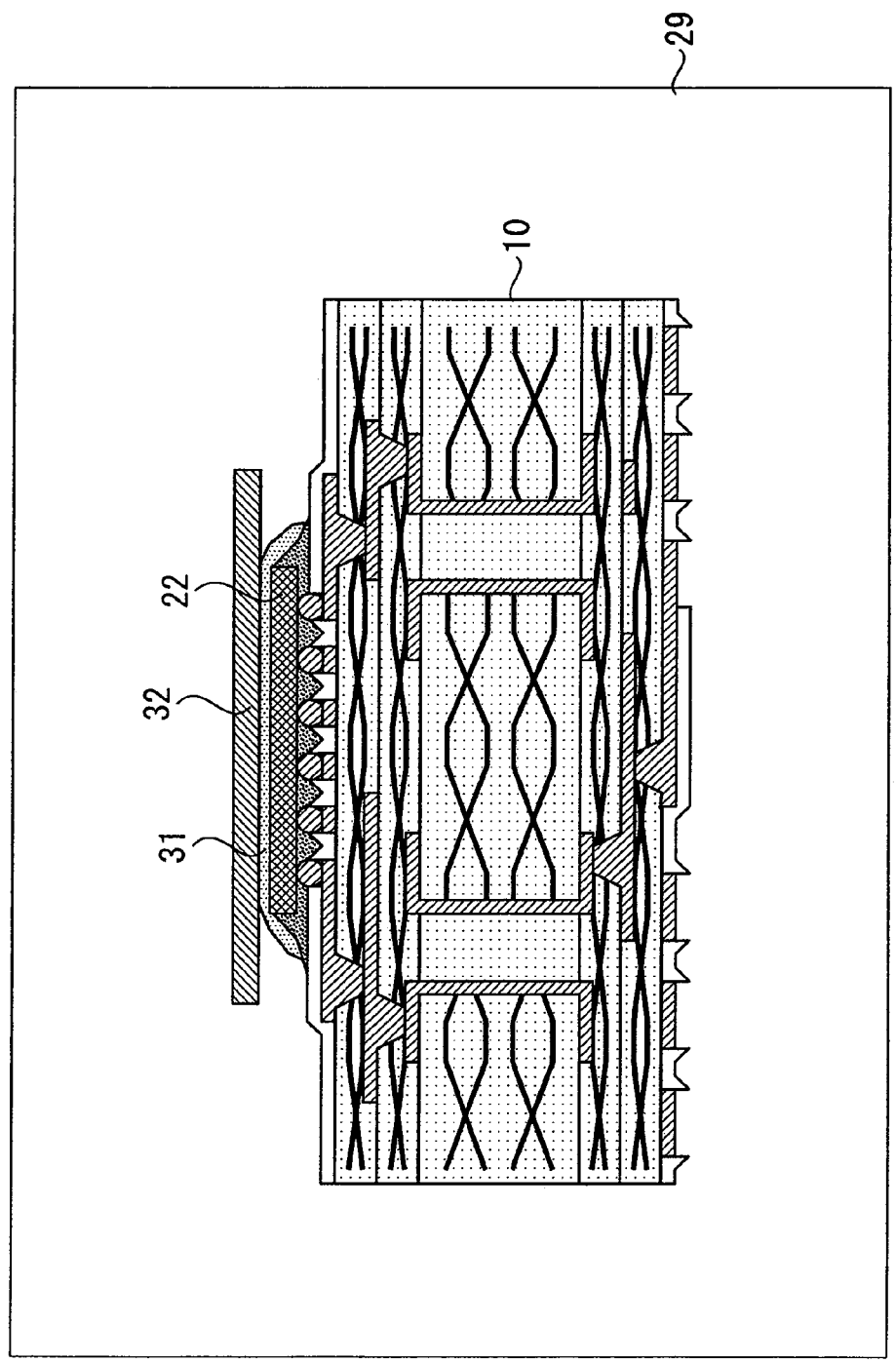
FIG. 14 is a sectional view showing the state that a wiring substrate, a semiconductor chip, and a heat spreader are put in a baking furnace, and baking is performed.

Next, as shown in FIG. 14, wiring substrate 10, semiconductor chip 22, and heat spreader 32 are put in baking furnace 29, baking is performed, and heat radiation resin 31 is cured. This mounts heat spreader 32 on semiconductor chip 22.

Figure 15:
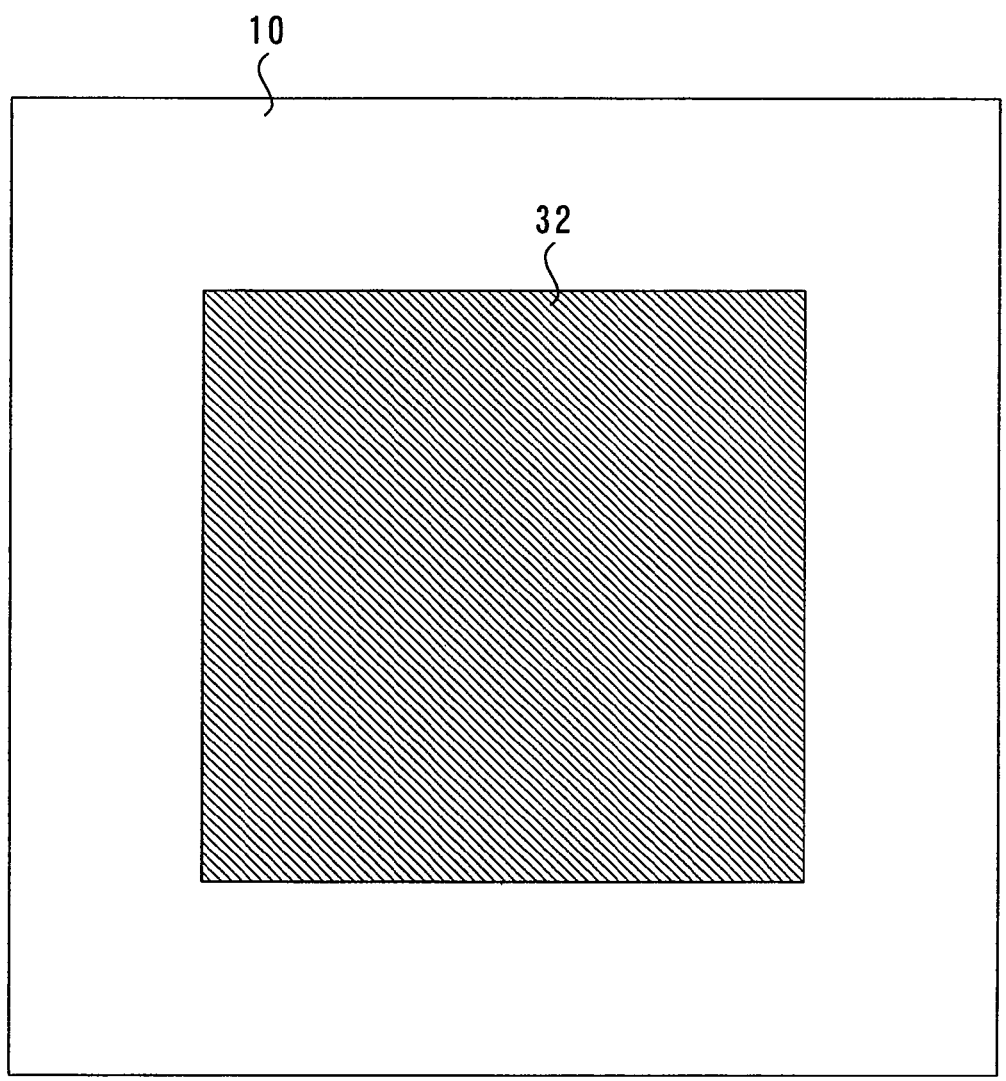
FIG. 15 is a top view showing the state where the heat spreader was mounted on the back surface of the semiconductor chip.

FIG. 15 is a top view showing the state of having mounted heat spreader 32 on semiconductor chip 22. Heat spreader 32 is made small compared with wiring substrate 10. Hereby, cost can be reduced. However, in order to secure heat radiation property, heat spreader 32 is made larger than semiconductor chip 22.

Next, the step which joins the solder ball used as an external connection terminal to the under surface of wiring substrate 10 is explained.

Figure 16:
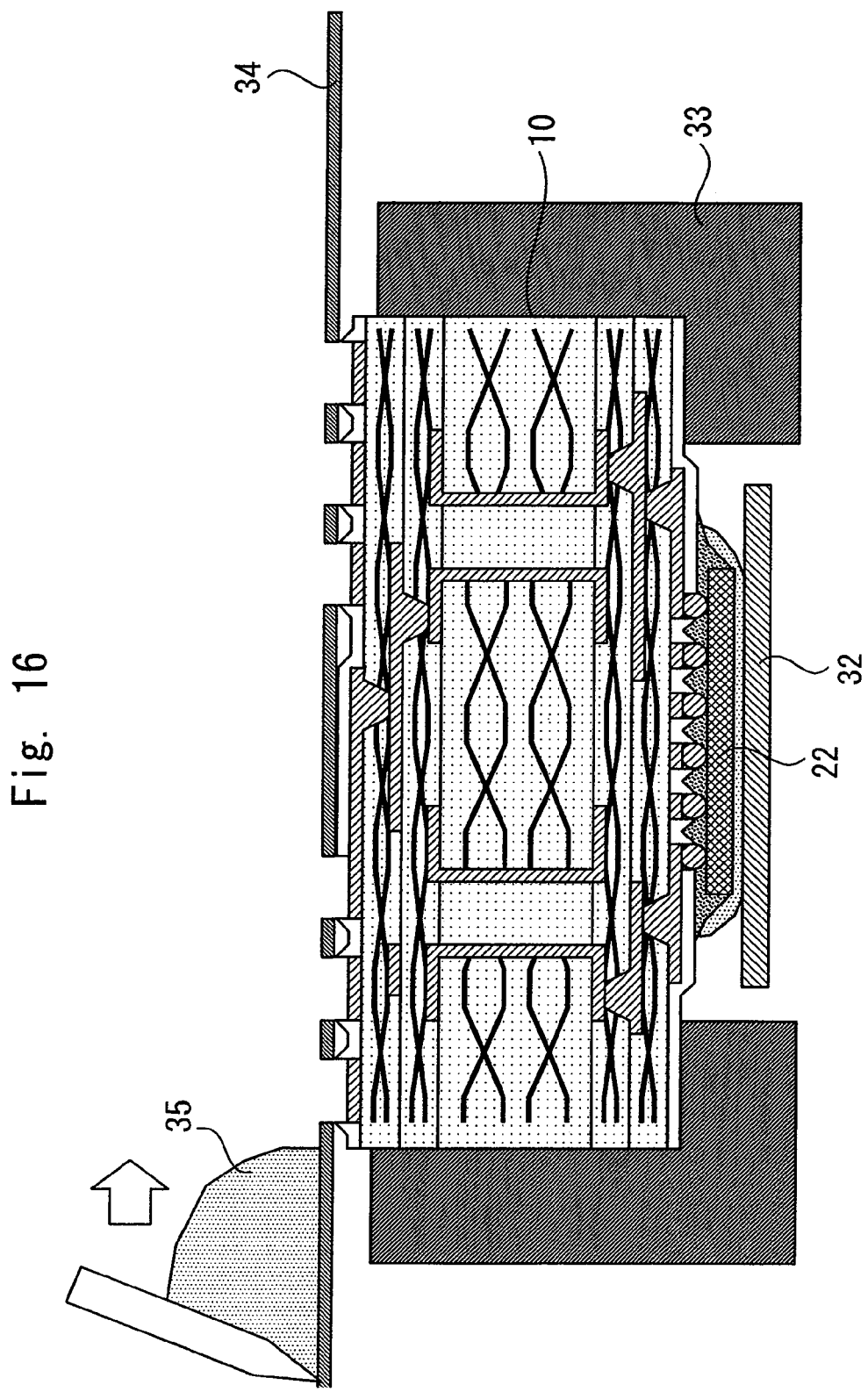
FIG. 16 is a sectional view showing the state that the flux is applied to the under surface of a wiring substrate.

First, as shown in FIG. 16, the upper surface of wiring substrate 10 is turned down, and wiring substrate 10 is held by hold means 33 which touches the portion which is the upper surface (surface on which semiconductor chip 22 was mounted) of wiring substrate 10 and the outside of heat spreader 32, and the side surface of wiring substrate 10. Hereby, wiring substrate 10 can be held, without giving stress to semiconductor chip 22 and heat spreader 32.

And where wiring substrate 10 is held, flux 35 is applied to the under surface of wiring substrate 10 via mask 34. Hereby, flux 35 is applied to wiring layer 18 exposed on the under surface of wiring substrate 10. However, soldering paste may be applied instead of flux 35.

Figure 17:
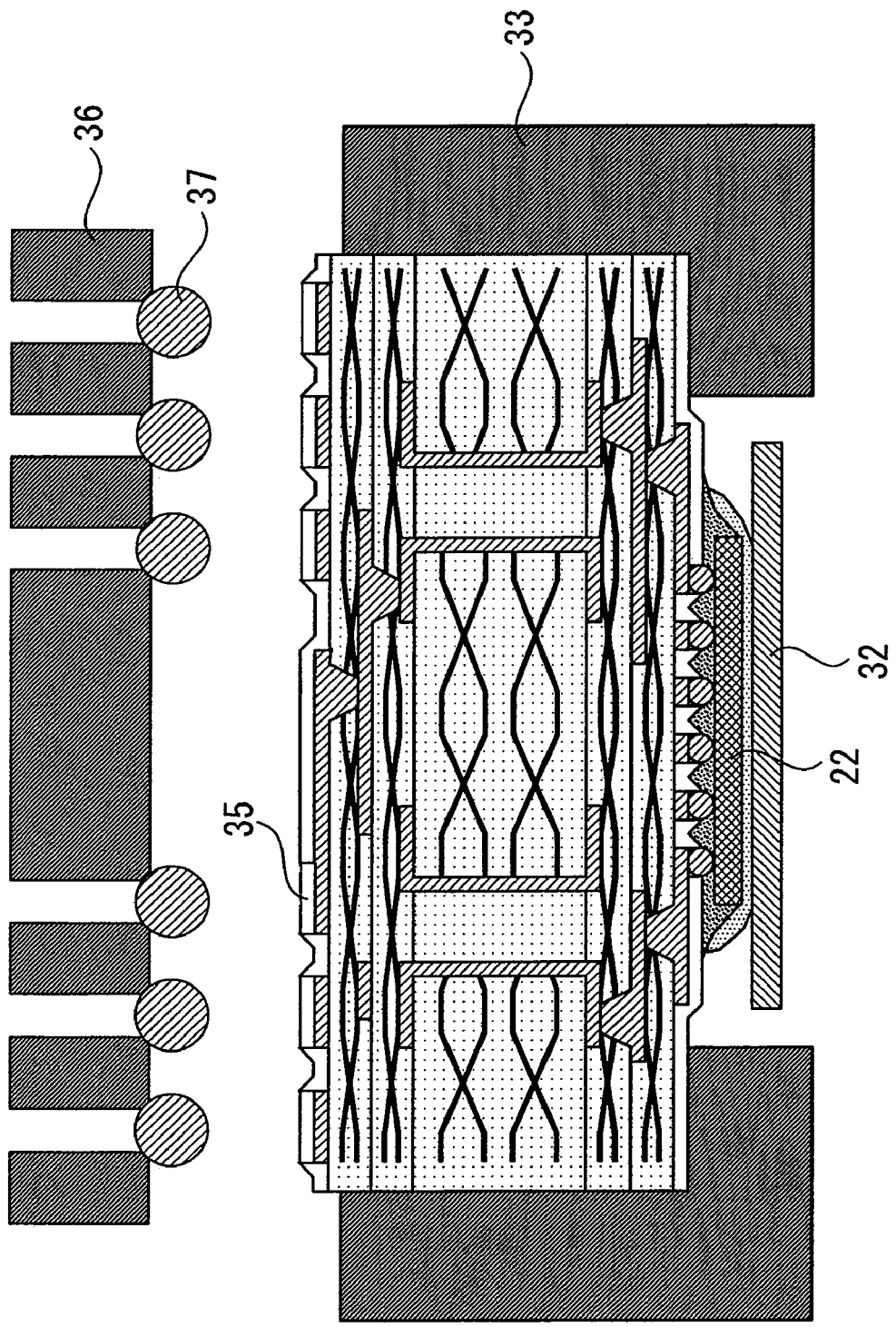
FIG. 17 is a sectional view showing the state where the solder ball was located above the wiring substrate.

Next, as shown in FIG. 17, vacuum adsorption of the solder ball 37 which includes lead free solder is made to the under surface of ball mounting head 36. And horizontal displacement of the ball mounting head 36 is made, and solder ball 37 is located above wiring substrate 10. And ball mounting head 36 is descended and solder ball 37 is mounted on flux 35 of wiring substrate 10. Then, adsorption of solder ball 37 by ball mounting head 36 is canceled, and ball mounting head 36 is raised.

Figure 18:
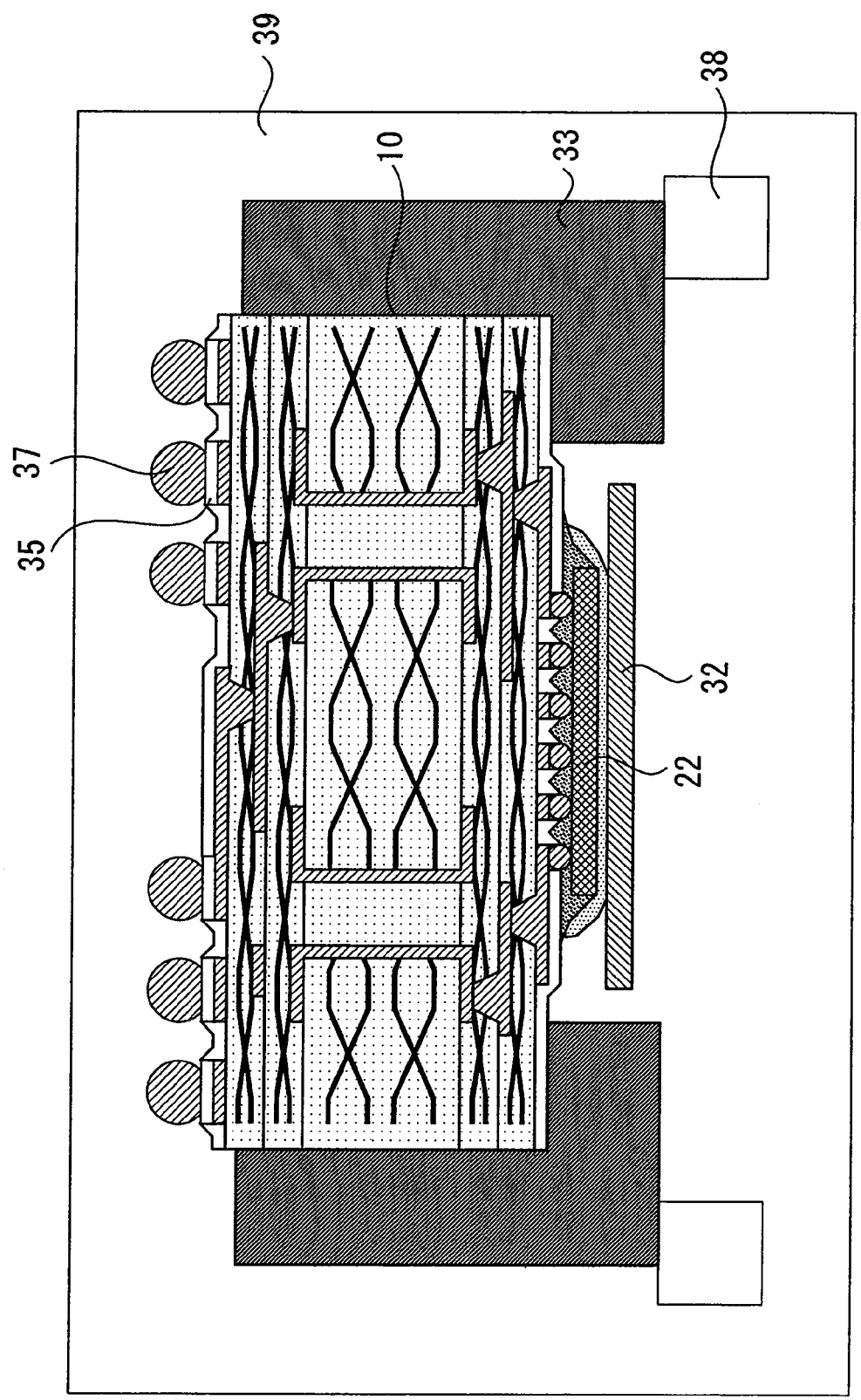
FIG. 18 is a sectional view showing the state that the wiring substrate which carried solder ball 37 is put in a reflow furnace, and reflow is performed.
Figure 19:
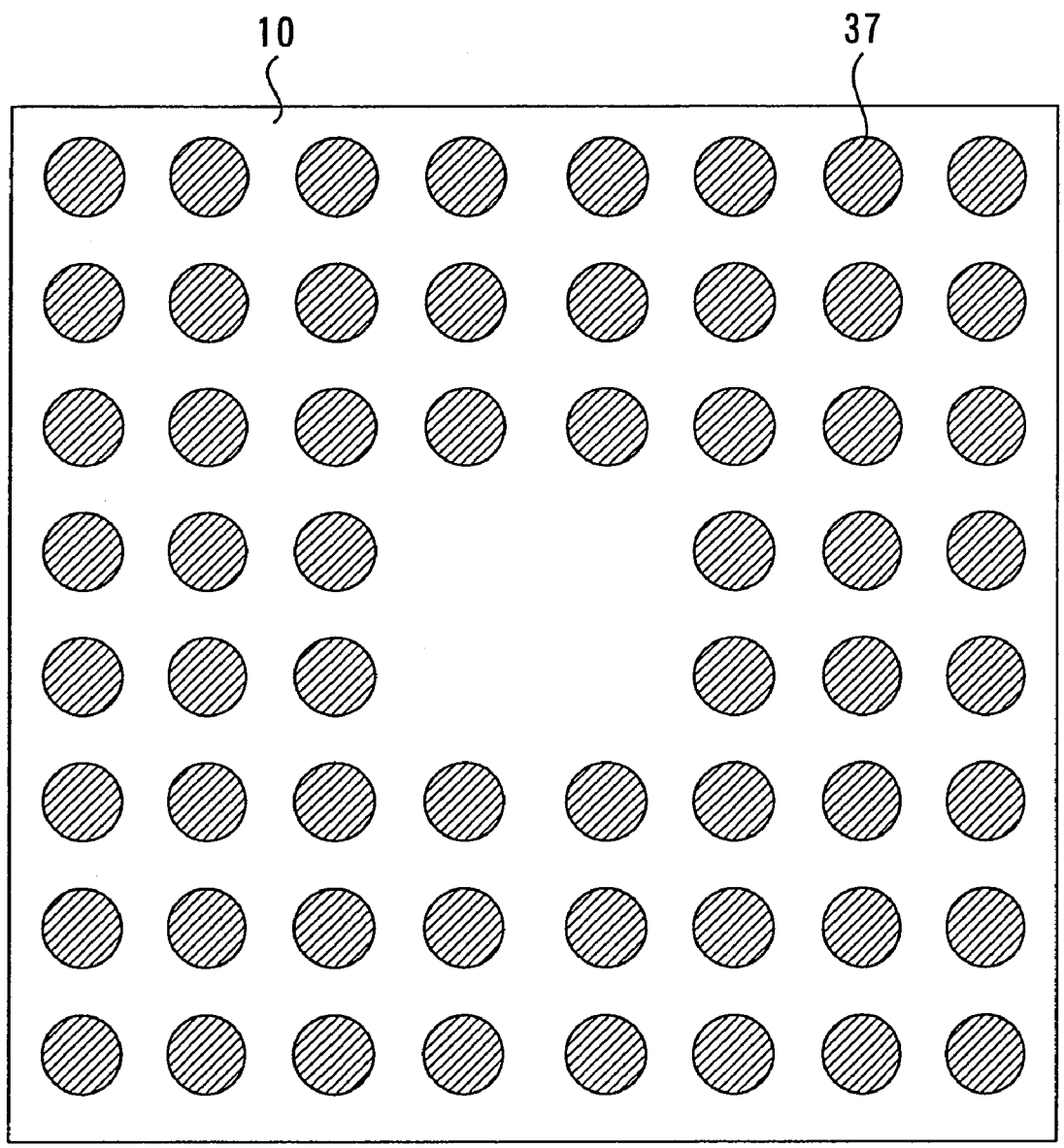
FIG. 19 is the bottom view of a wiring substrate on which the solder balls were adhered.

Next, as shown in FIG. 18, where wiring substrate 10 is held by hold means 33 turning solder ball 37 upwards, putting on conveyor 38, putting in ref low furnace 39, reflow is performed, and solder ball 37 is joined to wiring substrate 10. Then, flux 35 is removed by washing. FIG. 19 is a bottom view of the wiring substrate which joined the solder ball.

Figure 20:
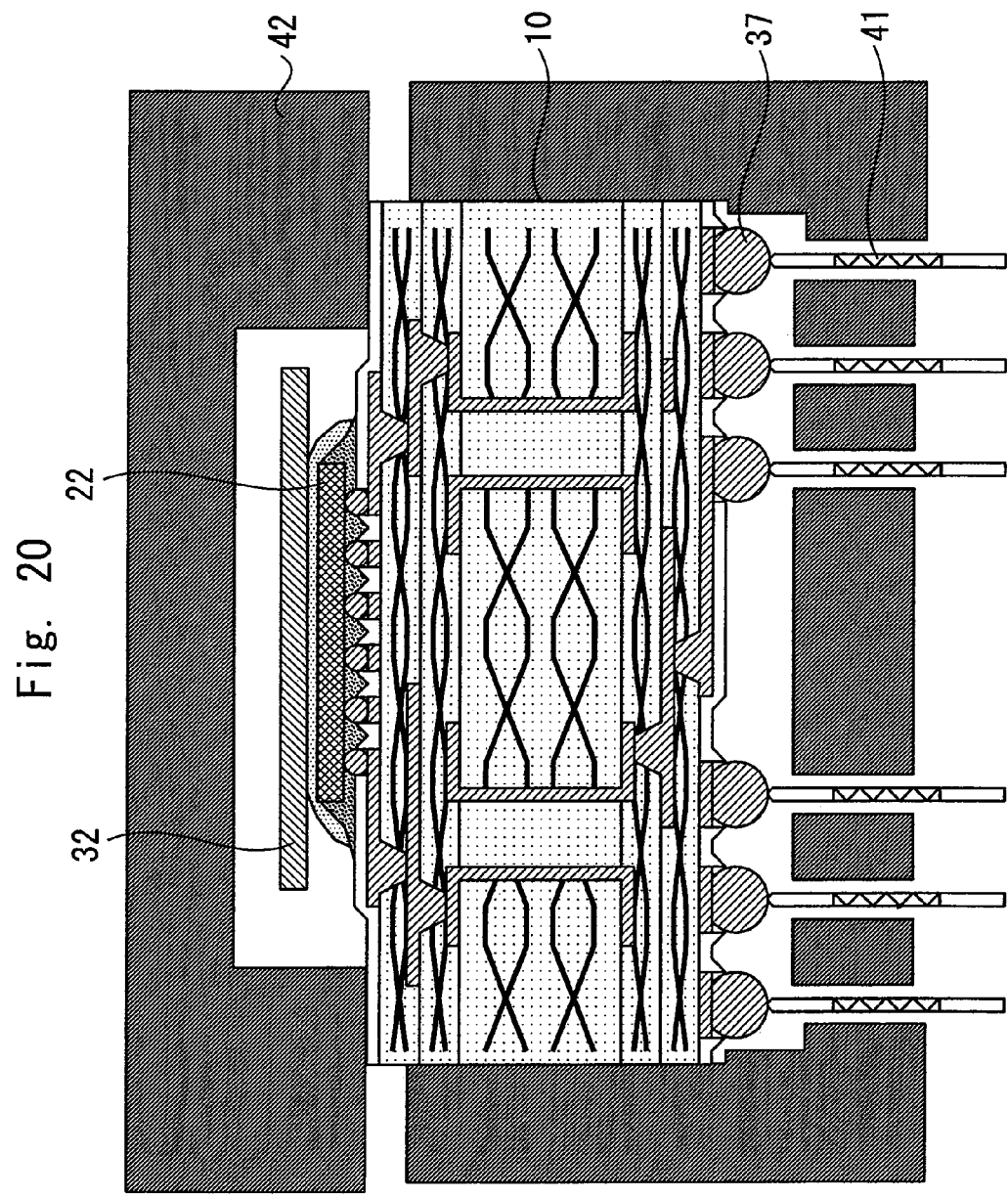
FIG. 20 is a sectional view showing the state where alignment of the solder ball was made on the test pin.

Next, as shown in FIG. 20, the surface which joined solder ball 37 of wiring substrate 10 is turned downward, and alignment of the solder ball 37 is made on test pin 41 which includes elastic members, such as a spring. And solder ball 37 of wiring substrate 10 is pushed against test pin 41 by pressing down wiring substrate 10 by pressing tool 42 from an upside. However, pressing tool 42 has the space which includes heat spreader 32 and semiconductor chip 22, and presses down the portion which is the upper surface of wiring substrate 10 and the outside of heat spreader 32.

The electric test of wiring substrate 10 and semiconductor chip 22 is done by exchanging an electrical signal between test pin 41 and solder ball 37 in this state.

Figure 21:
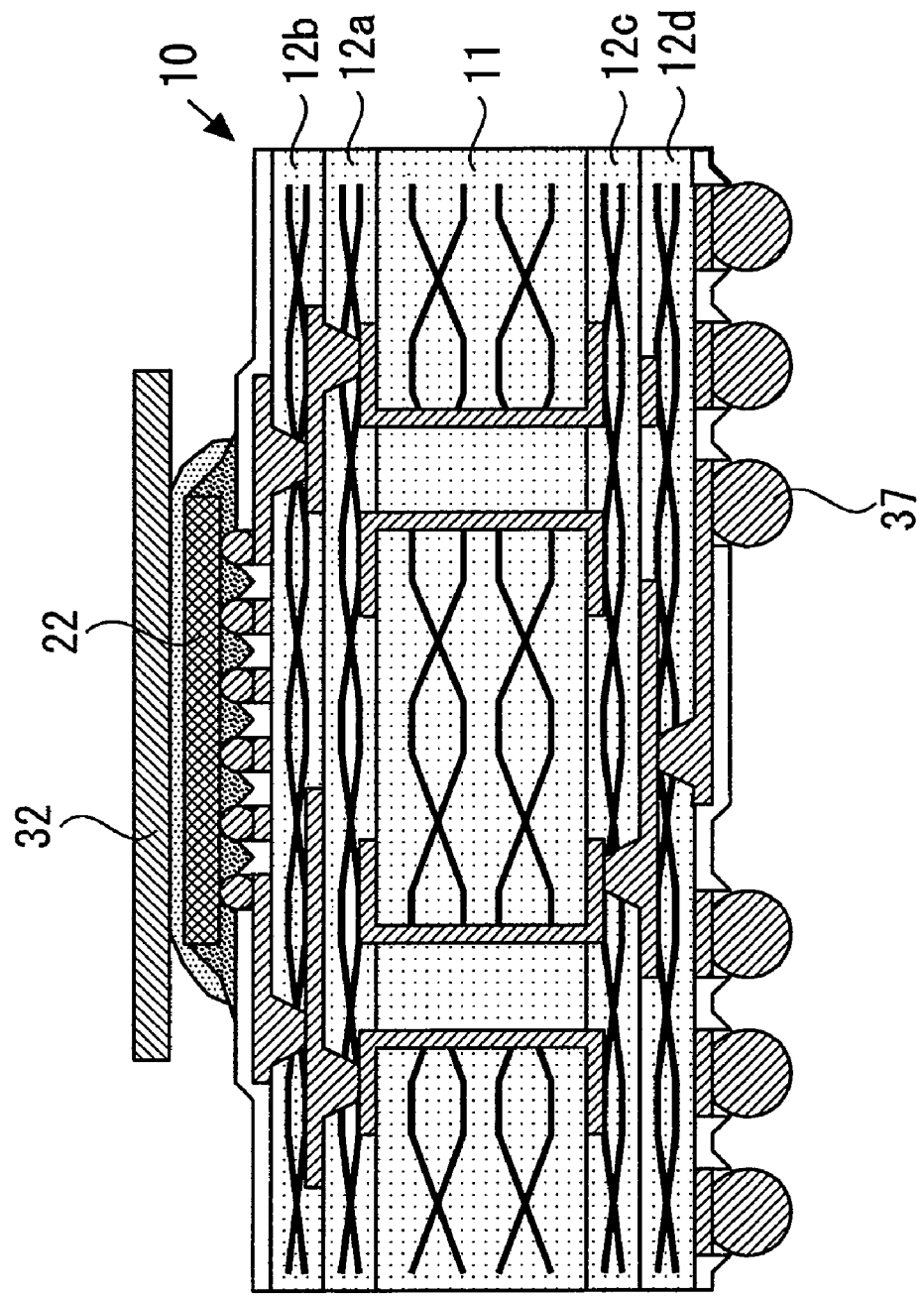
FIG. 21 is a sectional view showing the semiconductor device concerning Embodiment 1 of the present invention.

According to the above steps, the semiconductor device concerning Embodiment 1 of the present invention as shown in FIG. 21 is completed. Then, the above-mentioned semiconductor device is mounted on a mother board etc. using solder balls 37.

This semiconductor device omits the stiffener conventionally formed in order to reinforce the wiring substrate and to maintain the surface smoothness of the heat spreader for cost reduction, and has the shape which has a clearance more than or equivalent to the thickness of the chip between most portions which project to the perimeter of the chip of the heat spreader, and the wiring substrate upper surface. When there is much amount of under-filling resin 28, it may become the shape which fills between the very portion which projects to the perimeter of the chip of the heat spreader and the wiring substrate upper surface, but as compared with the case where it has a stiffener, the effect of reinforcement of a wiring substrate is very restrictive. Thus, in the shape which the great portion of wiring substrate upper surface of the perimeter of the chip exposes, the rigidity improvement in the wiring substrate itself becomes important. And in wiring substrate 10, a glass cloth is contained not only core substrate 11 but build-up substrate 12a-12d.

That is, wiring substrate 10 has a plurality of insulating substrates (core substrate 11 and build-up substrates 12a-12d) in which a through hole whose diameter differs, respectively was formed, and each insulating substrate contains a glass cloth. Wiring substrate 10 has the insulating substrate (build-up substrates 12a-12d) in which a through hole whose diameter is 100 μm or less was formed, and this insulating substrate also contains a glass cloth.

Hereby, rigidity can be made high as the wiring substrate 10 whole. Therefore, even when a stiffener is omitted for cost reduction, a warp and a distortion of wiring substrate 10 can be prevented. As compared with core substrate 11, formation of a finer through hole is required to the insulating layer which forms build-up substrates 12a-12d. By making the diameter of a through hole small, the area of the portion which can arrange a wiring becomes wide and the degree of freedom of a wiring layout improves. In particular, when there are many electrodes formed on semiconductor chip 22 as hundreds of or more pieces, i.e., the number of bumps 21, securing the layout degree of freedom of wiring layer 18 of the top layer which connects with bump 21 becomes important. So, securing the forming accuracy in a micro fabrication becomes indispensable at build-up substrate 12b with which through hole via 19 connected to wiring layer 18 of the top layer is formed in the inside. In this embodiment, in order to secure the forming accuracy of build-up substrates 12a-12d, the thickness of the glass cloth which build-up substrate 12a-12d contains is made thinner than the thickness of the glass cloth which core substrate 11 contains. The thickness of build-up substrates 12a-12d is also made thinner than core substrate 11. Thus, by using a thin glass cloth as compared with that of core substrate 11, and making thin build-up substrate 12a-12d each layer, forming accuracy is improved maintaining the rigidity of build-up substrates 12a-12d, and formation of fine through hole 17 is made easy. When using, for example what has a vulnerable porous low dielectric constant film etc. as compared with a TEOS film instead of conventional $SiO_2$ interlayer insulation film as semiconductor chip 22 like a description in this embodiment, to adopt build-up substrates 12a-12d which increased strength by the glass cloth is especially effective. That is, by increasing the strength of build-up substrates 12a-12d, the internal stress exerted on semiconductor chip 22 can be reduced, and the generation of peeling in the vulnerable layer of semiconductor chip 22 inside can be prevented. It is preferred as semiconductor chip 22 that organic system passivation films, such as a polyimide passivation film, are formed on the main surface. Organic system passivation films, such as polyimide, have high adhesion with under-filling resin 28 as compared with inorganic system passivation films, such as a SiN film. By covering main surface upper part of semiconductor chip 22 by an organic system passivation film, peeling at the interface of under-filling resin 28 and semiconductor chip 22 can be prevented. By maintaining the almost equal adhesion state of the interface of under-filling resin 28 and semiconductor chip 22, the generation of problems, such as peeling inside the low dielectric constant film by a local stress concentration, can be prevented. In this embodiment, the case where what has high rigidity by containing a glass cloth in each layer was used was described as wiring substrate 10. However, as a means which improves the rigidity of each layer of a wiring substrate, not only limited to the method of using the glass cloth which wove the glass fiber in the shape of a cloth, but also the method of using the nonwoven fabric type glass cloth formed by the glass fiber, the method of making the short glass fiber be contained as a reinforcement agent, etc. can be chosen suitably. Also as material of the fiber, not only the glass that uses silica as a base but the material which uses a carbon fiber can be chosen suitably.

Embodiment 2

Figure 22:
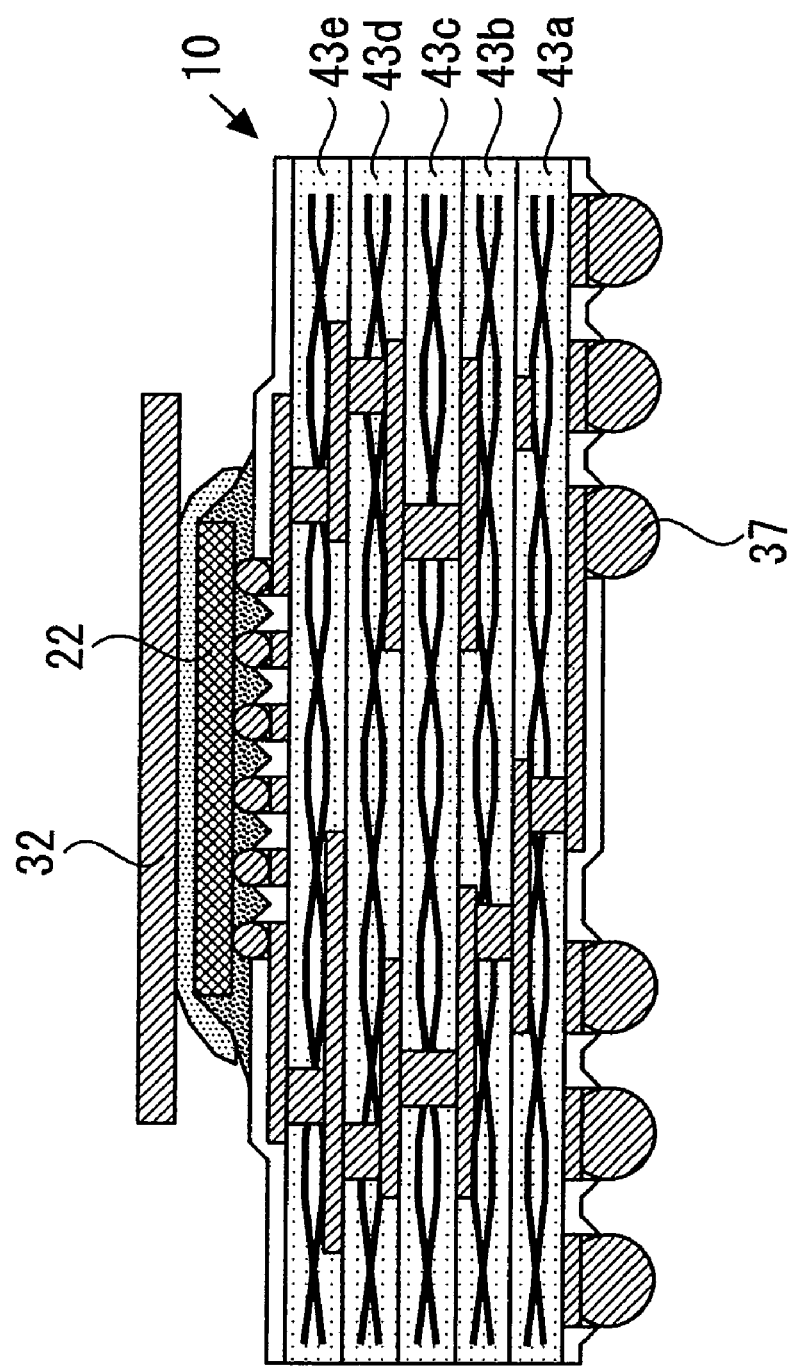

FIG. 22 is a sectional view showing the semiconductor device concerning Embodiment 2 of the present invention. The difference with Embodiment 1 is using the thing which made thin insulating substrates 43a-43d in which the through hole less than or equal to 100 μm was formed for the diameter bond by thermo-compression with a vacuum press etc., and made them unify, not using a core substrate as wiring substrate 10. However, each insulating substrates 43a-43d include the layer in which the glass cloth was impregnated with insulating resin, respectively, and was solidified platy. Other structure is the same as that of Embodiment 1.

Hereby, rigidity can be made high as the wiring substrate 10 whole. Therefore, even when the stiffener is omitted for cost reduction, a warp and a distortion of wiring substrate 10 can be prevented.

Embodiment 3

In Embodiment 3, heat radiation property is improved using the thing smaller than Embodiment 1 as a filler mixed in heat radiation resin 31. Concretely, the filler whose average particle diameter is 5.8 μm and whose maximum grain size is 24 μm is used.

And in order to control the thickness of heat radiation resin 31, a spacer which includes globular form zirconia is mixed in heat radiation resin 31. Concretely, the spacer whose average particle diameter is 25 μm and whose maximum grain size is 33 μm is used. The thickness of heat radiation resin 31 is controllable by this spacer to 60±20 μm.

That is, the desired thickness of heat radiation resin is set to A, average particle diameter of a spacer is set to C, and a spacer is chosen so that it may have the relation:

$$A \times 9/10 \geq C.$$

Hereby, the thickness of heat radiation resin is controllable within fixed limits centered on desired thickness.

And by setting the maximum grain size of a filler to $B_{MAX}$, and the maximum grain size of a spacer to $C_{MAX}$, a spacer is chosen so that it may have the relation:

$$C_{MAX} > B_{MAX}.$$

Hereby, the thickness of heat radiation resin is controllable by not a filler but a spacer.

Average particle diameter of a filler is set to B, the minimum particle size of a spacer is set to $C_{MIN}$, the particle diameter which occupies 90% of the occupying rate of a filler is made into $B_{90\%}$, and a spacer is chosen so that it may have any of relations:

$$C > B_{MAX},$$

$$C_{MIN} > B,$$

$$C_{MIN} > B_{90\%}.$$

Hereby, the utilization efficiency of a spacer can be improved.

In order to improve heat radiation property, the content in heat radiation resin of a spacer is made to less than or equal to 10 volume %, and preferably to less than or equal to 5 volume %.

Embodiment 4

In Embodiment 4, the flow property of heat radiation resin 31 which adheres semiconductor chip 22 and heat spreader 32 is set as the following values. Here, the flow property of heat radiation resin 31 shall be decided by making 1 g heat radiation resin dropped on a plane from the 10 mm upper part at room-temperature 25° C., and measuring the breadth of the heat radiation resin.

Conventionally, in this measuring method, the heat radiation resin of the flow property whose breadth is 19 mm was used. However, since resin is still a liquid state which has not solidified in the transportation after mounting heat spreader 32 on semiconductor chip 22 after mounting until curing when a stiffener is omitted, there was a problem that a drift of heat spreader 32 occurred by an oscillation and an inclination.

On the other hand, in Embodiment 4, the heat radiation resin of the flow property whose breadth is 4 mm or more, and 12 mm or less, for example, 8 mm, is used in the above-mentioned measuring method. Thus, a drift of heat spreader 32 can be prevented by using the heat radiation resin of flow property whose breadth is 12 mm or less. Since it fully gets wet and spreads when heat radiation resin 31 is applied on semiconductor chip 22 by using the heat radiation resin of flow property whose breadth is 4 mm or more, the generation of void can be prevented.

What is claimed is:

1. A semiconductor device comprising:
a wiring substrate including a core substrate having first and second surfaces opposed to each other, and first and second build-up substrates on the first and second surfaces of the core substrate, respectively;
the core substrate comprising a first insulating layer, and first wiring layers on the first and second surfaces, the first wiring layers being electrically connected to each other through first through holes in the core substrate,
the first build-up substrate comprising second insulating layers, and second wiring layers electrically connected to each other through second through holes in the first build-up substrate, and
the second build-up substrate comprising third insulating layers, and third wiring layers electrically connected to each other through third through holes in the second build-up substrate;
a semiconductor chip comprising a substrate which has third and fourth surfaces opposite to each other, and semiconductor elements on the third surface, a multilayer structure on the third surface, and pad electrodes on the multilayer structure, the multilayer structure including a wiring layer, a silicon oxide layer, and an interlayer insulating film, and the interlayer insulating film having an electrical constant lower that that of the silicon oxide film the semiconductor chip being on the first build-up substrate such that the third surface of the substrate faces the first build-up substrate and the semiconductor elements are electrically connected with the second wiring layers via first bump electrodes between the pad electrodes of the semiconductor chip and the first build-up substrate;
a resin layer between the semiconductor chip and the first build-up substrate and between the first bump electrodes; and
second bump electrodes on the second build-up substrate and electrically connected with the third wiring layers of the second build-up substrate, wherein
diameters of the second and third through holes of the first and second build-up substrates are smaller than diameters of the first through holes of the core substrate,
the first insulating layer of the core substrate, and the second and third insulating layers of the first and second build-up substrates, contain glass cloths, respectively, and
a thickness of the glass cloths in each of the first and second build-up substrates is smaller than a thickness of the glass cloths in the core substrate.

2. The semiconductor device according to claim 1, further comprising a heat spreader on the semiconductor chip,
wherein the heat spreader has a size larger than the semiconductor chip such that peripheral edges of the heat spreader extend beyond those of the semiconductor chip.

3. The semiconductor device according to claim 1, wherein the inter layer insulating film includes at least one of SiOC and SiOF films.

4. The semiconductor device according to claim 1, wherein each of the first and second build-up substrates is thinner than the core substrate.

5. The semiconductor device according to claim 1, wherein each of the diameters of the second and third through holes of the first and second build-up substrates is in the range of 30 to 100 micro meters.

6. The A semiconductor device according to claim 1, wherein the first bump electrodes are formed of lead free solder.

7. The semiconductor device according to claim 1, wherein the semiconductor chip further comprises:
   a multilayer structure on the third surface of the substrate; and
   pad electrodes on the multilayer structure, wherein
   the multilayer structure includes a wiring layer, a silicon oxide film, and an interlayer insulating film, and
   the interlayer insulating film has an electrical constant lower than that of the silicon oxide film.

8. The semiconductor device according to claim 7, wherein
   the silicon oxide film is located at a surface of the multilayer structure, and
   the pad electrodes are exposed from the silicon oxide film to provide electrical connection to the first bump electrodes.

9. The semiconductor device according to claim 8, wherein the silicon oxide film is located at a first surface of the multilayer structure to cover the semiconductor elements.

10. The semiconductor device according to claim 9, wherein
    another silicon oxide film is located at a second surface of the multilayer structure, the first and second surface being opposite to each other, and
    the pad electrodes are exposed from the another silicon oxide film to provide electrical connection to the first bump electrodes.

11. A semiconductor device comprising:
    a wiring substrate including a core substrate having first and second surfaces opposed to each other, and first and second build-up substrates on the first and second surfaces of the core substrate, respectively;
       the core substrate comprising a first insulating layer, and first wiring layers on the first and second surfaces, the first wiring layers being electrically connected to each other through first through holes in the core substrate,
       the first build-up substrate comprising second insulating layers, and second wiring layers electrically connected to each other through second through holes in the first build-up substrate, and
       the second build-up substrate comprising third insulating layers, and third wiring layers electrically connected to each other through third through holes in the second build-up substrate,
    a semiconductor chip comprising a substrate which has third and fourth surfaces opposite to each other, semiconductor elements having a MOSFET on the third surface, a silicon oxide film formed to cover the MOSFET, a plug electrode buried in the silicon oxide film and electrically connected with the MOSFET, an internal wiring layer on the silicon oxide film and electrically connected with the plug electrode, an interlayer insulating film formed on the silicon oxide film, an internal wiring layer buried in the interlayer insulating film, and pad electrodes formed on the interlayer insulating film and electrically connected with the internal wiring layer,
       the interlayer insulating film having an electrical constant lower than that of the silicon oxide film,
       the semiconductor chip being on the first build-up substrate such that the third surface of the substrate faces the first build-up substrate and the semiconductor elements are electrically connected with the second wiring layers via first bump electrodes between the pad electrodes of the semiconductor chip and the first build-up substrate;
    a resin layer between the semiconductor chip and the first build-up substrate and between the first bump electrodes; and
    second bump electrodes on the second build-up substrate and electrically connected with the third wiring layers of the second build-up substrate, wherein
    diameters of the second and third through holes of the first and second build-up substrates are smaller than diameters of the first through holes of the core substrate,
    the first insulating layer of the core substrate, and the second and third insulating layers of the first and second build-up substrates, contain glass cloths, respectively, and
    a thickness of the glass cloths in each of the first and second build-up substrates is smaller than a thickness of the glass cloths in the core substrate.

12. The semiconductor device according to claim 11, wherein the inter layer insulating film includes at least one of SiOC and SiOF films.

13. The A semiconductor device according to claim 11, wherein a further silicon oxide film is formed on the interlayer insulating film, wherein the pad electrodes are formed on the further silicon oxide film, and wherein the interlayer insulating film has an electrical constant lower than that of the further silicon oxide film.

14. The semiconductor device according to claim 13, wherein a passivation film is formed on the further silicon oxide film, and wherein a portion of the pad electrodes is exposed from the passivation film.

15. The semiconductor device according to claim 12, wherein the internal wiring layer includes a Cu wiring.

16. The semiconductor device according to claim 15, wherein each of the pad electrodes includes an aluminum electrode.

17. The semiconductor device according to claim 14, wherein a barrier metal layer is formed between the pad electrodes and the first bump electrodes respectively.

* * * * *